United States Patent
Reece et al.

(10) Patent No.: US 6,828,572 B2
(45) Date of Patent: Dec. 7, 2004

(54) ION BEAM INCIDENT ANGLE DETECTOR FOR ION IMPLANT SYSTEMS

(75) Inventors: Ronald N. Reece, Westwood, MA (US); Michael A. Graf, Cambridge, MA (US); Thomas Parrill, North Andover, MA (US); Brian S. Freer, Medford, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/404,493

(22) Filed: Apr. 1, 2003

(65) Prior Publication Data

US 2004/0195528 A1 Oct. 7, 2004

(51) Int. Cl.[7] .......................... G01N 21/00; G01N 23/00; G21K 5/10
(52) U.S. Cl. .............................. 250/492.21; 250/491.1; 250/492.1; 250/492.3
(58) Field of Search ....................... 437/222; 178/19.01; 355/53; 250/491.1, 492.1, 492.21, 492.3

(56) References Cited

U.S. PATENT DOCUMENTS

| | | | |
|---|---|---|---|
| 4,234,797 A | * | 11/1980 | Ryding .................... 250/492.3 |
| 5,113,074 A | | 5/1992 | Sferlazzo |
| 5,160,846 A | | 11/1992 | Ray |
| 5,436,790 A | | 7/1995 | Blake et al. |
| 5,572,038 A | | 11/1996 | Sheng et al. |
| 6,095,928 A | * | 8/2000 | Goszyk ...................... 473/222 |
| 6,137,112 A | * | 10/2000 | McIntyre et al. ....... 250/492.21 |
| 6,153,836 A | * | 11/2000 | Goszyk ................... 178/19.01 |
| 6,194,734 B1 | | 2/2001 | Loomis et al. |
| 6,207,964 B1 | | 3/2001 | McIntyre et al. |
| 6,255,662 B1 | | 7/2001 | Rubin et al. |
| 6,437,350 B1 | | 8/2002 | Olson et al. |
| 6,507,388 B2 | * | 1/2003 | Burghoorn ................... 355/53 |
| 6,690,022 B2 | * | 2/2004 | Larsen et al. .......... 250/492.21 |
| 2001/0006413 A1 | * | 7/2001 | Burghoorn ................... 355/53 |
| 2002/0079465 A1 | | 6/2002 | Halling |
| 2002/0121889 A1 | | 9/2002 | Larsen et al |

* cited by examiner

*Primary Examiner*—Nikita Wells
*Assistant Examiner*—Mary El-Shammaa
(74) *Attorney, Agent, or Firm*—Eschweiler & Associates, LLC

(57) ABSTRACT

The present invention facilitates semiconductor device fabrication by monitoring and correcting angular errors during ion implantation procedures via an incident ion beam angle detector. Additionally, the present invention facilitates semiconductor device fabrication by calibrating a process disk with respect to an incident ion beam without measuring implantation results on wafers prior to an ion implantation process.

42 Claims, 18 Drawing Sheets

ION BEAM INCIDENT ANGLE DETECTOR FOR ION IMPLANT SYSTEMS

FIELD OF INVENTION

The present invention relates generally to semiconductor device fabrication and ion implantation, and, more particularly, to calibrating, detecting and/or modifying an ion beam incident angle during setup or in situ.

BACKGROUND OF THE INVENTION

Ion implantation is a physical process that is employed in semiconductor device fabrication to selectively implant dopant into semiconductor and/or wafer material. Thus, the act of implanting does not rely on a chemical interaction between a dopant and semiconductor material. For ion implantation, dopant atoms/molecules are ionized, accelerated, formed into a beam, analyzed, and swept across a wafer, or the wafer is swept through the beam. The dopant ions physically bombard the wafer, enter the surface and come to rest below the surface, at a depth related to their energy.

An ion implantation system is a collection of sophisticated subsystems, each performing a specific action on the dopant ions. Dopant elements, in gas or solid form, are positioned inside an ionization chamber and ionized by a suitable ionization process. In one exemplary process, the chamber is maintained at a low pressure (vacuum). A filament is located within the chamber and is heated to the point where electrons are created from the filament source. The negatively charged electrons are attracted to an oppositely charged anode also within the chamber. During the travel from the filament to the anode, the electrons collide with the dopant source elements (e.g., molecules or atoms) and create a host of positively charged ions from the elements in the molecule.

Generally, other positive ions are created in addition to desired dopant ions. The desired dopant ions are selected from the ions by a process referred to as analyzing, mass analyzing, selection, or ion separation. Selection is accomplished utilizing a mass analyzer that creates a magnetic field through which ions from the ionization chamber travel. The ions leave the ionization chamber at relatively high speeds and are bent into an arc by the magnetic field. The radius of the arc is dictated by the mass of individual ions, speed, and the strength of the magnetic field. An exit of the analyzer permits only one species of ions, the desired dopant ions, to exit the mass analyzer.

An acceleration system is employed to accelerate or decelerate the desired dopant ions to a predetermined momentum (e.g., mass of an dopant ion multiplied by its velocity) to penetrate the wafer surface. For acceleration, the system is generally of a linear design with annular powered electrodes along its axis. As the dopant ions enter therein, they are accelerated therethrough.

However, a number of potential problems can occur during ion implantation procedures that can damage and/or destroy semiconductor devices being fabricated. One potential problem encountered during ion implantation is an unacceptable degree of electrical charging (wafer charging) of the wafer surface. For example, an ion beam can carry excessive positive charges that charge or buildup on a wafer surface. The positive charge can draw neutralizing electrons from the surface, the bulk, the beam, structures, layers, and the like and degrade or destroy such components. Additionally, excessive charge buildup can cause voltages and/or current to be applied to semiconductor device components in an uncontrolled manner thereby damaging the device components.

Another potential problem encountered during ion implantation is an incorrect angle of implantation. Generally, an ion implantation is performed at a specific angle with respect to a wafer surface. If a calibration error or angular error is present (e.g., process equipment is not calibrated properly) the ion implantation can be performed at a different angle, location and/or depth than intended. Such errors can undesirably modify the implantation profile, fail to dope certain areas, implant dopants into unintended areas, damage device structures, dope to an incorrect depth, and the like.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor device fabrication by monitoring and correcting angular errors before and/or during ion implantation procedures. Additionally, the present invention facilitates semiconductor device fabrication by calibrating a process disk with respect to an incident ion beam without requiring measurement of implantation results on wafers.

The present invention employs an ion beam incident angle detector that passes charged ions there through as a function of an incident angle of an ion beam. The charged ions generate a signal (beam current or charge potential) that is a function of the incident angle of the ion beam. The angle detector of the present invention has an aperture with an aspect ratio that facilitates accuracy and can increase a signal to noise ratio. One or more of these angle detectors can be employed prior to ion implantation device fabrication processes in order to calibrate a process disk, wafer, and/or an end station holding a work piece with respect to an incident ion beam. During calibration, the angle detectors provide values for various so-called "alpha and beta" offset angles, which are about orthogonal axes and are typically related to the wafer twist and tilt. Generally, an incident ion beam substantially normal to a wafer or disk surface should yield the largest value. Thus, based on these provided/measured peak values, angular error can be detected and correction values determined.

During ion implantation processes for semiconductor device fabrication, the angle detector may provide values, which can then be compared with previous and/or expected charge values to determine if a correction in situ should be performed. On identifying an angular error during processing, process parameters including angular offset values are modified or adjusted to at least partially correct the identified angular error.

According to one aspect of the present invention, an angle detector comprises a tube portion that passes charged ions as a function of an incident angle of the ions, and a capacitor or detector portion that accumulates charged ions. The tube portion has an aspect ratio that facilitates accuracy and can increase a signal to noise ratio. The angle detectors provide peak charge values for various angular offset angles.

Generally, an incident ion beam substantially normal to a wafer or disk surface should yield the largest peak value. Thus, based on these provided/measured peak charge values, angular error can be detected and correction values determined.

According to another aspect of the present invention, an angle detector comprises a tube portion and a profile hole, that pass charged ions as a function of an incident angle of the ions, and a disk faraday that measures beam current according to charged ions that pass through an aperture defined by the tube and profile hole. The aperture has an aspect ratio that facilitates accuracy and can reduce a signal to noise ratio. The angle detectors provide peak beam current values for various angular offset angles. Generally, an incident ion beam substantially normal to a wafer or disk surface should yield the largest measured beam current value. Thus, based on these provided/measured beam current values, angular error can be detected and correction values determined.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
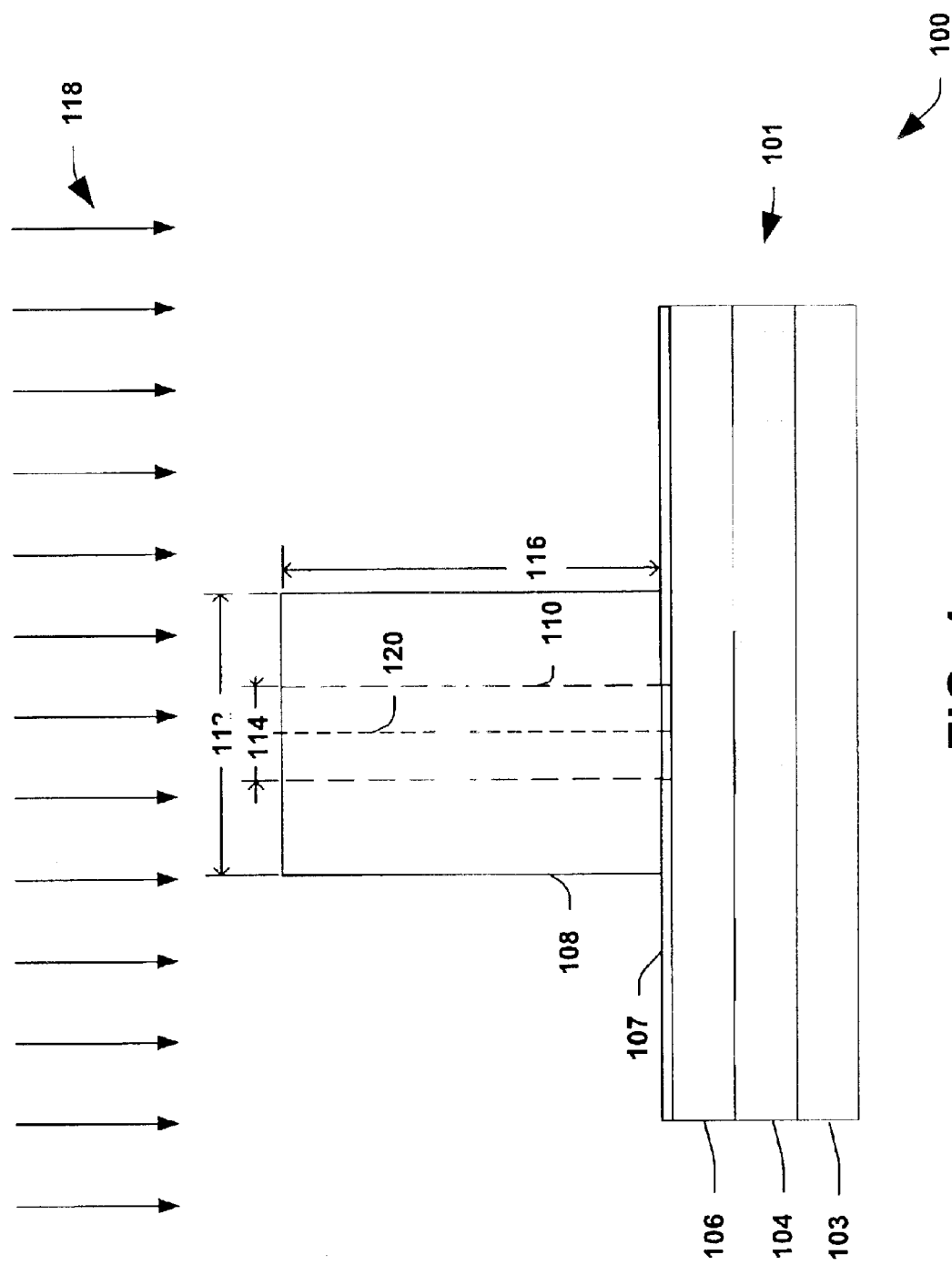
FIG. 1 is a cross sectional view illustrating a beam incident angle detector in accordance with an aspect of the present invention.

The present invention will now be described with reference to the attached drawings, wherein like reference numerals are used to refer to like elements throughout. It will be appreciated by those skilled in the art that the invention is not limited to the exemplary implementations and aspects illustrated and described hereinafter.

The present invention facilitates semiconductor device fabrication by monitoring and correcting angular errors during ion implantation procedures by utilizing one or more ion beam incident angle detectors, discussed infra. Additionally, the present invention facilitates semiconductor device fabrication by calibrating a process disk with respect to an incident ion beam without measuring implantation results on wafers by again employing one or more ion beam incident angle detectors.

Beginning now with FIG. 1, a cross sectional view of a beam incident angle detector 100 in accordance with an aspect of the present invention is illustrated. The angle detector 100 detects and/or identifies angular error of an ion beam for ion implantation systems by collecting charge as a function of the beam incident angle. The angle detector 100 is typically located on a process disk of an end station in a process area where wafers are generally located or, alternately, in a non-process area where wafers are not generally located. The angle detector 100 can be one of a number of beam incident angle detectors located on a process disk or the angle detector 100 can be the only angle detector located on a process disk. Additionally, the angle detector 100 can optionally function as a charge monitoring device, wherein the angle detector 100 monitors a buildup of charge during processing thereby permitting corrective actions to be taken in response.

The angle detector 100 includes a charge collector 101 and a tube portion 108 located on the charge collector 101. The charge collector 101 comprises a first plate 103, a dielectric layer 104 formed on the first plate, and a second plate 106 formed on the dielectric layer. The first plate 103 and the second plate 106 are comprised of a conductive material such as a metal (e.g., aluminum). The dielectric layer 104 is comprised of a dielectric material such as $SiO_2$ (silicon dioxide) or man-made dielectrics (Kapton, Mylar, etc.)

The tube portion 108 has an aperture 110 extending therethrough that permits charged ions from an ion beam 118 to pass through to the charge collector 101 and thereby build up a charge thereon. The tube 108 is comprised of a conductive material such as a metal (e.g., aluminum) and is connected to ground. Alternately, the tube 108 could be biased to some other voltage value and still be in accordance with the present invention. Consequently, ions that impact on the tube tend to lose their electrical charge (e.g., whether positive or negative). The tube portion 108 is one of a number of suitable beam discriminating structures that can be employed with the present invention.

An insulative layer 107 is disposed between the capacitor 101 and the tube 108 and electrically isolates the tube 108 from the second plate 106 of the capacitor 101. The insulative layer 107 is comprised of an insulative material such as a dielectric material or air. Additionally, the insulative layer 107 also has an aperture or opening associated therewith that is generally coaxial with the tube aperture 110. The tube 108 has a height 116 and a width 112. Additionally, the aperture 110 of the tube 108 has a width 114, which is substantially similar to the aperture of the insulative layer 107. Initially, charged ions enter the aperture 110 and begin to pass through the tube. If the charged ions from the beam 118 are not traveling substantially in line or parallel with an axis 120 the tube 108 but at an angle or offset from the axis 120, at least a portion of the charged ions will impact the interior sidewalls of the tube 108 and consequently lose their charge. The charged ions that pass through the tube 108 impact the charge collector 101 which in one example funnels the collected charge to a capacitor on a back portion of the process disk. Ions from the beam 118 that have impacted the interior sidewalls of the tube 108 can still pass through the tube 108 and strike the charge collector 101, but fail to substantially contribute to the charge thereon because their charge has been dissipated by impacting the interior of the tube 108. Alternatively, ions from the beam 118 that impact the interior sidewalls of the tube 108 are collected or trapped by the tube and do not exit, and thus do not reach the charge collector. Generally, the greater the angle of incidences offset with respect to the axis 120, the less charge buildup occurs. Consequently, a greater magnitude of charge indicates a superior angle of incidence, that is, the beam is substantially parallel with the axis 120.

The angle detector 100 has an aspect ratio defined as a ratio of the tube height 116 to the aperture width 114. The aspect ratio should be selected such that an adequate and/or minimum number of ions pass through the aperture 110 and that misalignment relative to a surface is discernable. Generally, the dimensions, height 116, tube width 112, and aperture width 114, and aspect ratio are selected so that enough ions pass through to obtain a sufficient signal without losing the accuracy of the alignment or misalignment. Additionally, the tube 108 is illustrated as being cylindrical, however the present invention contemplates that a variety of cross-sectional shapes and/or dimensions (e.g., circles or other polygons) are suitable for the tube 108 so long as they permit sufficient signal strength and selection of aspect ratio.

The conductive portions of the angle detector 100 are typically comprised of a metal material such as aluminum, and coated with a material that is compatible with semiconductor processing, such as a silicon coating. Otherwise, a sputtering type process could result from ions impacting a material such as aluminum and damage or contaminate the end station, process disk, wafers, and the like. However, other materials can be employed and still be in accordance with the present invention. Additionally, existing charge monitors can be adapted and/or configured to include the tube portion (e.g., by mounting the tube on a ground plane of a charge monitor) and thereby become an angle detector in accordance with the present invention. Although the example above illustrates the present invention in a batch or multi-wafer end station, it should be understood that the present invention may also be employed in a single wafer system, and such alternatives are contemplated as falling within the scope of the present invention.

Figure 2:
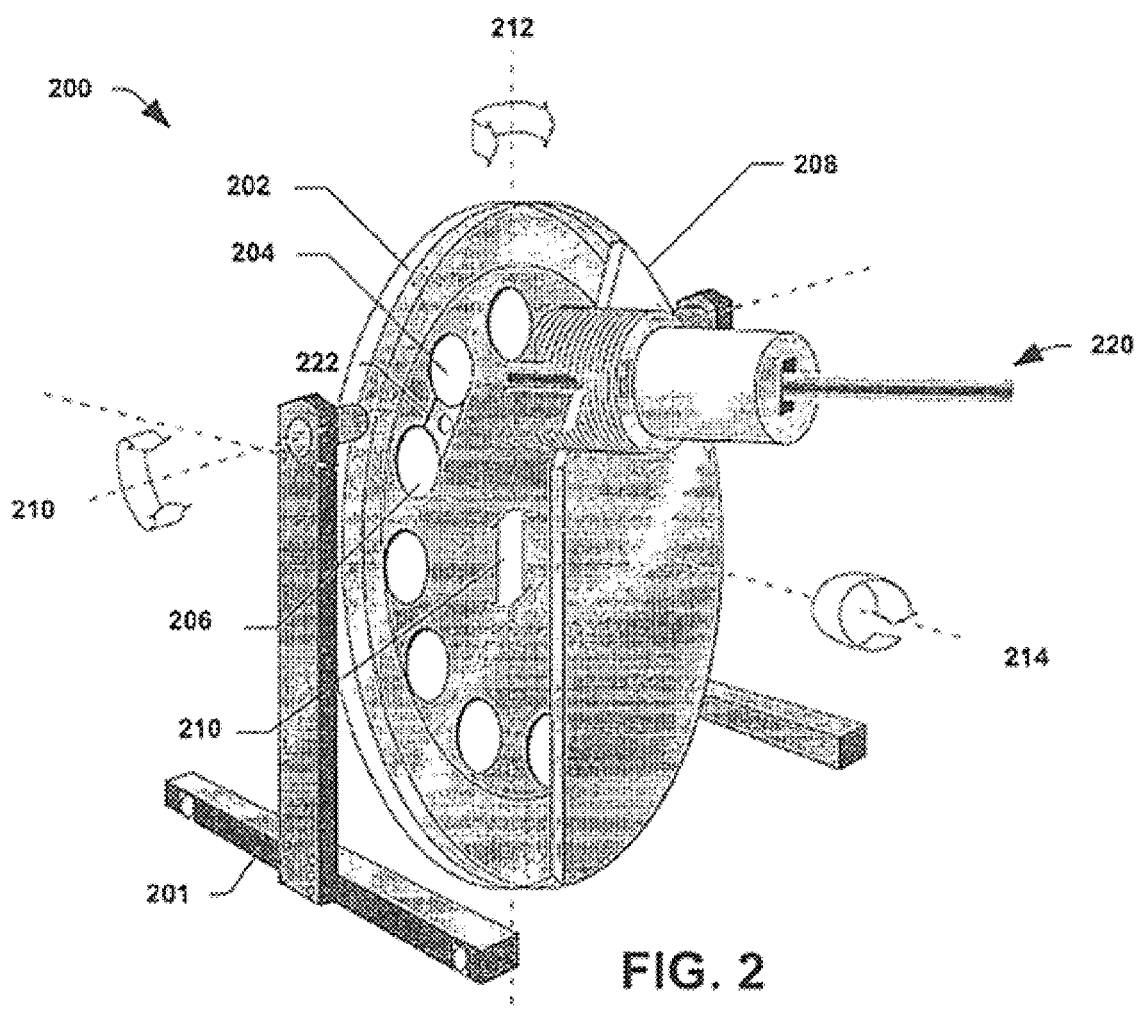
FIG. 2 is a perspective view illustrating an end station of an ion implantation system having a beam incident angle detector in accordance with an aspect of the present invention.

Continuing on with FIG. 2, a perspective view of an end station 200 for an ion implantation device is depicted in accordance with an aspect of the present invention. The end station 200 is operable to be calibrated and adjusted in situ in accordance with the present invention. The end station 200 permits and performs substantially accurate ion implantation procedures therein facilitating semiconductor device fabrication.

The end station 200 at least partially includes a process chamber 202 and a chamber mount 201, which support the process chamber 202. The process chamber 202 comprises a process disk 204 that holds a number of wafers 206 and flexible stainless bellows 208 allow the end station to about one or more axes with respect to the ion beam. The wafers 206 are located on the process disk within a scan/process area or region in which an ion beam can pass into during an implantation procedure. The process disk 204 is rotatable about orthogonal axes 210, 212 (an alpha axis and a beta axis) that are related to process disk tilt and twist. During operation of a typical ion implantation process, the process disk rotates about an axis of rotation 214 at speeds that can vary upon the particular device being fabricated and the ion implantation being performed. An exemplary rotational speed is 1200 rotations per minute (rpm), however other suitable rotational speeds can be employed and still be in accordance with the present invention. During operation of an ion implantation process, an ion beam 220 is scanned across the process disk 204 in a vertical direction 210. Thus, the ion beam 220 is swept across the wafers 206, which are located in the area scanned by the ion beam.

The process disk 204 additionally includes one or more beam angle detector(s) 222, which provide a relative measurement of charge potential that is a function of the ion beam's 220 angle with respect to the process disk. The angle detectors 222 can be located within the scan area or, alternatively, can be located in an area reachable by the ion beam 220 but outside of the typical scan/process area. The ion beam 220 also scans across the one or more beam angle detectors 222. The beam angle detector(s) 222 can optionally and additionally operate as a charge monitor, wherein the detectors 222 can detect charge buildup (positive or negative) and initiate a corrective action on the charge buildup exceeding a threshold amount. The corrective action is an appropriate and/or sufficient response to excessive charge buildup that reduces the charge buildup to an acceptable level. As an example, a suitable corrective action is to add electrons to a positively charged ion beam in order to reduce an excessive buildup of positive charge and is sometimes referred to as charge neutralization.

Semiconductor device fabrication processes typically include ion implantation procedures that require performance/implantation at specific angles. As stated supra, the process disk 204 is rotatable about an alpha axis 210 and the beta axis 212 that may be related to the twist and tilt of the wafer, respectively. This property permits a wafer to be implanted at a controlled angle by modifying alpha and beta angles, associated with the alpha axis 210 and the beta axis 212, respectively. Prior to performing an ion implantation process, the process disk 204 can be calibrated, generally for alpha and beta angles of zero that represent a beam normal to the workpiece. A number of suitable mechanisms can be employed to perform this calibration.

One suitable mechanism is to perform a number of ion implants on a set of test wafers and compare the actual implants to expected implants. A series of implants at a number of varied alpha and beta angles are performed on the test wafers in order to identify and/or correct angular error. The test wafers are special grade wafers specifically developed (e.g., from the same crystal boule) for testing and cannot be later used to fabricate semiconductor devices. As a result, this mechanism of calibration can be expensive in terms of time and materials. The depth of the implant as well as other characteristics and/or features that vary with implant depth and position of features such as channeling features can be measured and/or otherwise obtained. These measurements, once obtained for the varied alpha and beta angles, can be compared against each other and expected/ desired results to determine if a calibration and/or angular error is present. A number of suitable measurement techniques can be employed to measure these features. One is to directly measure the implant features via a scanning electron microscope, scatterometry, ellipsometry, reflectometry and the like. Another is to measure sheet resistance, which varies with implant depth for a given dose. Other suitable techniques can also be employed. The obtained measurements are compared with expected results to determine if there exists a calibration error, also referred to as an angular error, and if so, determines alpha and beta calibration factors that can then be applied to calibrate alpha and beta values of zero. Subsequently, a verification test can be performed to verify that the calibration was appropriate. If the verification fails, another calibration is then performed, and so on until satisfactory calibration is achieved.

Another suitable mechanism is to employ the beam angle detector(s) 222 in order to calibrate the process disk 204. The beam angle detectors 222 comprise a tube and a detector (e.g., a charge collector) and permit ions from the ion beam to pass through the tube and strike the detector/capacitor. The tube has an aspect ratio selected to facilitate accuracy and signal to noise ratio. The beam angle detectors 222 can optionally monitor tube current in addition to charge or peak of charge. Probes or other suitable mechanisms can be employed to obtain charge values from the beam angle detectors. Additionally, an angle implant board (not shown) processes signals/values received from the beam angle detectors 222. The angle implant board can be similar to a charge monitor board, and processes and determines peak charge values from the beam angle detectors 222 individually and/or collectively.

A set of test wafers or a set of process wafers are inserted onto the process disk. The process wafers are wafers that will subsequently undergo a desired ion implantation process. However, the process wafers can only be employed for calibration if the beam angle detector(s) 222 are configured or positioned on the process disk such that the ion beam can pass over them during the calibration process without hitting the wafers. A number of process recipes, that include variations on alpha and beta angles, are determined. As one example, the process recipes include a range of varied beta values while alpha is held constant, and include a range of varied alpha values while beta is held constant. However, it is appreciated that other ranges and values can be employed in accordance with the present invention. Then, ion implantations are performed according to the number of process recipes. During these ion implantations, charge data is obtained from the beam angle detector(s) 222. This charge data is then employed to determine if there exists a calibration error, also referred to as an angular error, and if so, determine alpha and beta calibration factors. It is appreciated that this mechanism does not require measuring or inspecting of the wafers in order to detect and/or correct calibration errors. Additionally, it is appreciated that the presence of wafers are not necessary for purposes of calibration, but can be present for convenience and/or to protect sensitive surfaces on the process disk that hold the wafers from damage via ion beam(s). Thus, the present invention includes performing the above calibration with or without wafers present.

Subsequent to calibration, an ion implantation process can be performed. If test wafers were employed for calibration, the process wafers are now inserted onto the process disk 204; otherwise the process wafers are already in place. Once the ion implantation process has begun, the one or more beam angle detector(s) 222 provide feedback data. From this feedback data, measured charge can be compared to an expected measured charge thereby providing an indication of a calibration or angular error during the ion implantation process. A database of previously detected charge values during similar ion implantation procedures can be employed, or alternatively and preferably, an intelligent control system can be employed in an iterative process to determine the offsets required to achieve alpha and beta offsets. Some errors can be corrected by adjusting the alpha and beta angles by appropriate offset amounts. Control signals (not shown) can be sent to alpha and beta motors (not shown) to appropriately adjust the alpha and beta angles. Other errors can indicate a more serious problem and can initiate a suitable corrective action, such as terminating the test. However, it is appreciated that some angular errors can have a severity such that the wafers are damaged and not recoverable. Yet, even in such a case, early detection of severe implantation errors can prevent unnecessary continued processing of the un-recoverable devices/wafers.

Figure 3:
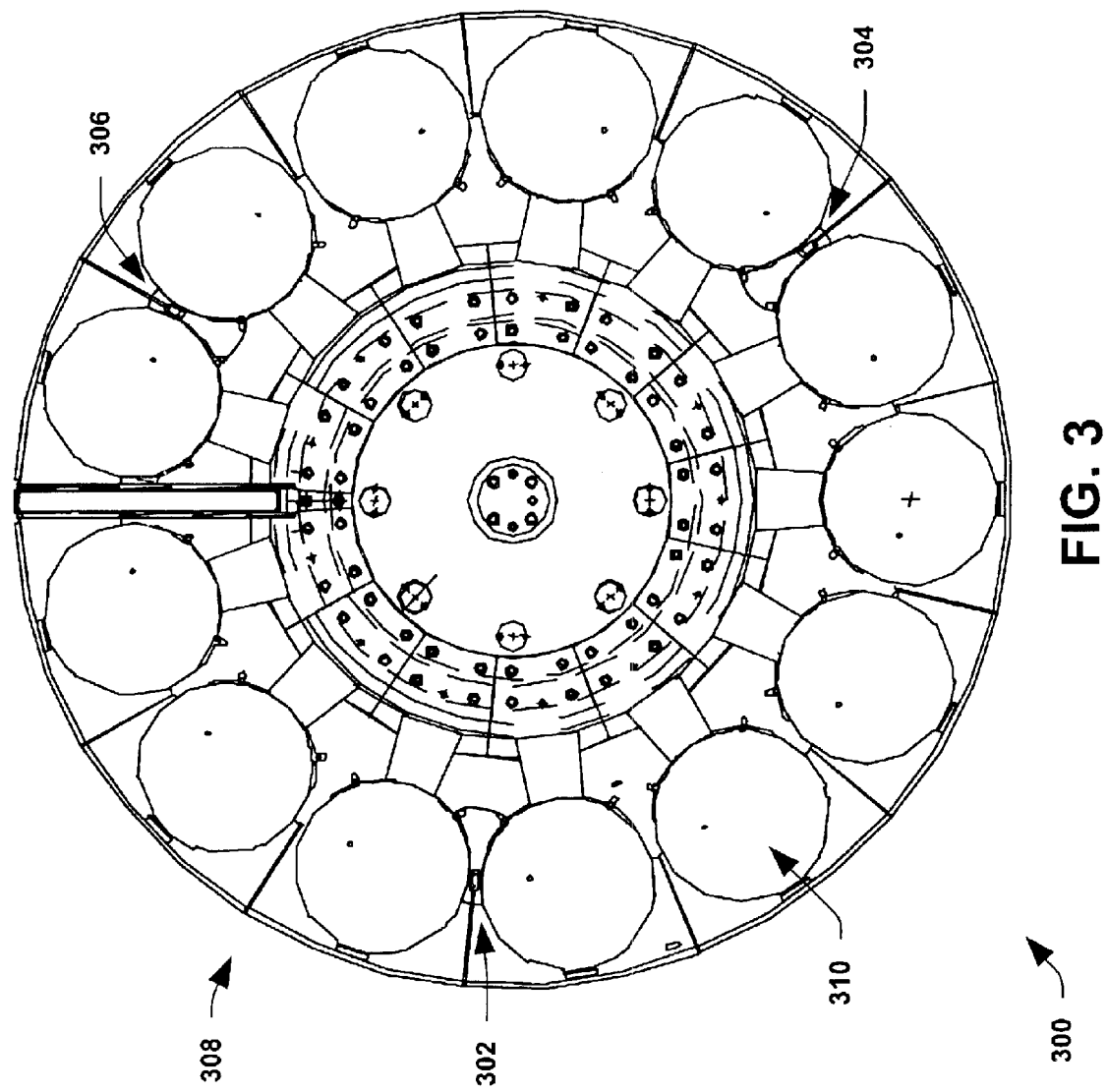
FIG. 3 is a plan view illustrating a configuration of beam incident angle detectors on a process disk in accordance with an aspect of the present invention.

Turning now to FIG. 3, a plan view of a configuration of beam incident angle detectors on a process disk 300 in accordance with an aspect of the present invention is illustrated. In this configuration, a first angle detector 302, a second angle detector 304, and a third angle detector 306 are located within the scanning range of the ion implantation area for process wafers on a process disk 308. Additionally, a number of wafers 310 are located on the process disk 308 as shown. The angle detectors (304, 306, and 308) are also further operable as charge detection units. It is appreciated that the present invention is not limited to a specific number of angle detectors, and there is no limit to the number of detectors other than that limited by space on the process disk.

The configuration illustrated in FIG. 3 is suitable for in situ ion angle beam detection in which an ion beam scanning occurs across the wafers 310, typically at set alpha and beta angles, and concurrently also scans across the angle detectors thereby causing charge to buildup on the detectors. If the charge buildup detected by the angle beam detectors (304, 306, and 308), particularly the magnitude of the charge, varies substantially from that expected, it is likely that an angular error has developed and/or been introduced into the ion implantation process. As discussed supra, angular error or calibration errors can be introduced into an ion implantation system in a number of ways (e.g., earthquake, miscalibration, misalignment, dynamic steering, jarring, equipment failure, and the like). The detected charge from the angle detectors (304, 306, and 308) can also be compared with accumulated charge data from one or more charge monitors (not shown) to differentiate charge buildup from angular errors. Based on the feedback data, adjustments can be made to the alpha and beta angles. The wafers 310 employed during the in situ process are process wafers.

Additionally, the configuration of FIG. 3 is also suitable for a calibration procedure that is typically performed prior to an ion implantation process employed in semiconductor device fabrication. However, test wafers, dummy wafers or previously used wafers may be used as the wafers 310 instead of process wafers to avoid unintended damage and/or damaging ion implantation to the process wafers. The calibration procedure includes a number of process recipes, which include variations on alpha and beta angles. Each recipe includes a number of parameters and characteristics for ion implantation including, for example, alpha values and beta values (e.g., implant angle), dopant materials, beam strength, implant energy level, and the like. Generally, the process recipes are substantially similar with respect to each other, but for the alpha and beta values, which generally vary from recipe to recipe. As one example, the process recipes include a range of varied beta values while alpha is held constant and include a range of varied alpha values while beta is held constant. However, it is appreciated that other ranges and values can be employed in accordance with the present invention. Then, ion implantations are performed according to the number of process recipes. During these ion implantations, charge data is obtained from the beam angle detectors (302, 304, and 306), which, as previously discussed, is a function of the angle of implant of the ion beam.

Generally, the charge accumulated from the detectors (302, 304, and 306) is greater for an ion beam that is more normal to the process disk (e.g., wafer surface). This charge data is then employed to determine if a calibration error, also referred to as an angular error, exists. As an example, a beta value of 0.5 that yields a greater accumulated charge than a beta value of 0, with alpha being held constant, indicates angular error. Continuing, if a calibration error is detected, alpha and beta calibration factors are determined.

It is appreciated that the calibration procedure discussed above does not require measuring or inspecting of the wafers in order to detect and/or correct calibration errors. Furthermore, it is appreciated that variations in the process disk, configuration, number of wafers, and the like are permitted and in accordance with the present invention. Additionally, it is appreciated that this configuration is but one of many possible configurations that can be employed in accordance with the present invention.

Figure 4:
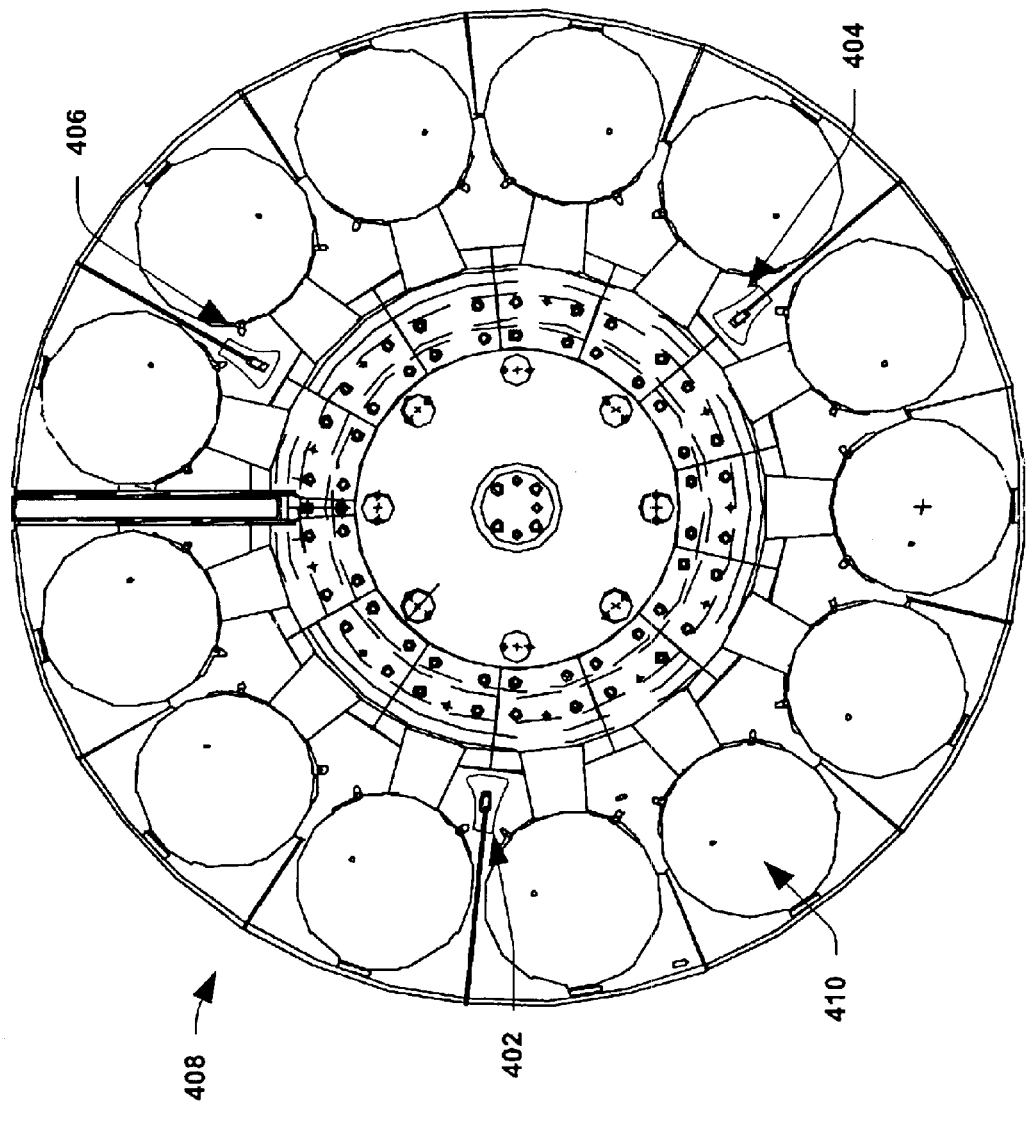
FIG. 4 is a plan view illustrating another configuration of beam incident angle detectors on a process disk in accordance with an aspect of the present invention.

FIG. 4 is a plan view illustrating another configuration of beam incident angle detectors on a process disk 400 in accordance with an aspect of the present invention. In this configuration, a first angle detector 402, a second angle detector 404, and a third angle detector 406 are not located within a scanning area of wafers on a process disk 408, but are located or mounted inboard, which is inside of the area normally implanted. Additionally, a number of wafers 410 are located on the process disk.

The configuration of FIG. 4 is particularly suitable for a calibration procedure performed prior to performance of an ion implantation process as part of a semiconductor device fabrication process. Typically, the calibration procedure is performed to identify, detect and correct angular error for alpha and beta values of zero. Because of the location of the angle detectors (402, 404, 406), the wafers 410 can be process wafers (however, process wafers are not required) during the calibration procedure because the ion beam does not scan across the wafers 410. The ion beam scanning area is adjusted to cover an area that includes the angle detectors but excludes the wafers.

The calibration procedure employs a number of process recipes, which include variations on alpha and beta angles. Each recipe includes a number of parameters and characteristics for an ion implantation including, for example, alpha values and beta values (e.g., implant angle), dopant materials, beam strength, implant energy level, and the like. Generally, the number of process recipes is substantially similar with respect to each other, but for the alpha and beta values, which generally vary from recipe to recipe. As one example, the process recipes include a range of varied beta values while alpha is held constant and include a range of varied alpha values while beta is held constant. However, it is appreciated that other ranges and values can be employed in accordance with the present invention. Then, ion implantations are performed according to the number of process recipes. During these ion implantations, charge data is obtained from the beam angle detectors (402, 404, and 406), which, as previously discussed, is a function of the angle of implant of the ion beam. Generally, the charge accumulated from the detectors (402, 404, and 406) is greater for an ion beam that is more normal to the process disk (e.g., wafer surface). This charge data is then employed to determine if a calibration error, also referred to as an angular error, exists. As an example, a beta value of 1.5 that yields a greater accumulated charge than a beta value of 0, with alpha being held constant, indicates angular error. Continuing, if a calibration error is detected, alpha and beta calibration factors are determined.

It is appreciated that the calibration procedure discussed above does not require measuring or inspecting of the wafers in order to detect and/or correct calibration errors. Furthermore, it is appreciated that variations in the process disk, configuration, number of wafers, and the like are permitted in accordance with the present invention.

It is appreciated that the configurations described in FIG. 3 and FIG. 4 are exemplary in nature and that the present invention is not so limited to only those configurations. Furthermore, it is appreciated that varying numbers of angle detectors and locations can be utilized and still be in accordance with the present invention. For example, a suitable configuration could be one in which one or more angle detectors are located within an area scanned during ion implantation (e.g., for use in calibration and/or in situ) and also include one or more angle detectors located within an area outside that scanning area (e.g., for use in calibration).

Figure 5:
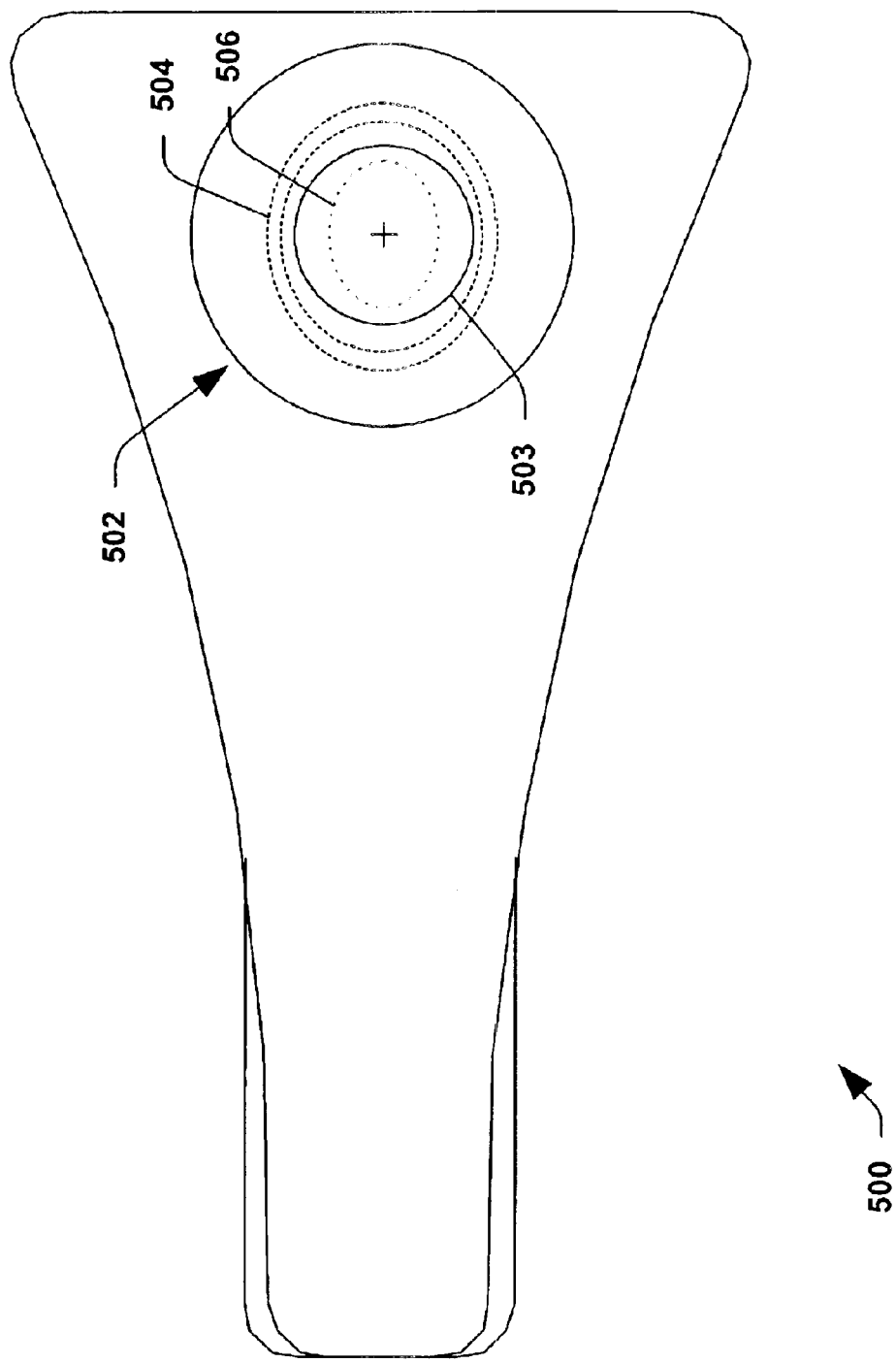
FIG. 5 is a plan view illustrating a beam incident angle detector in accordance with an aspect of the present invention.

Continuing, FIG. 5 is a plan view depicting a beam incident angle detector 500 in accordance with an aspect of the present invention. This view further illustrates an ion beam passing directly on the angle detector 500. The beam angle detector 500 is but one of many suitable angle detectors that can be utilized in accordance with the present invention. This beam angle detector 500 can also be employed as a charge detector during an ion implantation process. The detector 500 includes a tube portion 502 having an aperture 503 there through, as illustrated in the view. The tube 502 and the aperture 503 are depicted as being cylindrical in shape. However, it is appreciated that other types of shapes (e.g., square, rectangular, triangular, and the like) can be employed for the cross-sectional profile of the tube 502 and the aperture 503 and are contemplated in accordance with the present invention.

An ion portion 506, here positively charged, of an ion beam is shown located within the aperture portion 503. An election portion 504 is shown as located outside the aperture portion 503. As a consequence, a charge magnitude substantially related to only the positively charged ions 506 is obtained wherein the electrons have only a minimal effect on the charge magnitude. Such an arrangement facilitates calibration and angular error adjustments by at least partially removing electrons from the detected charge at or about its maximum value.

Figure 6:
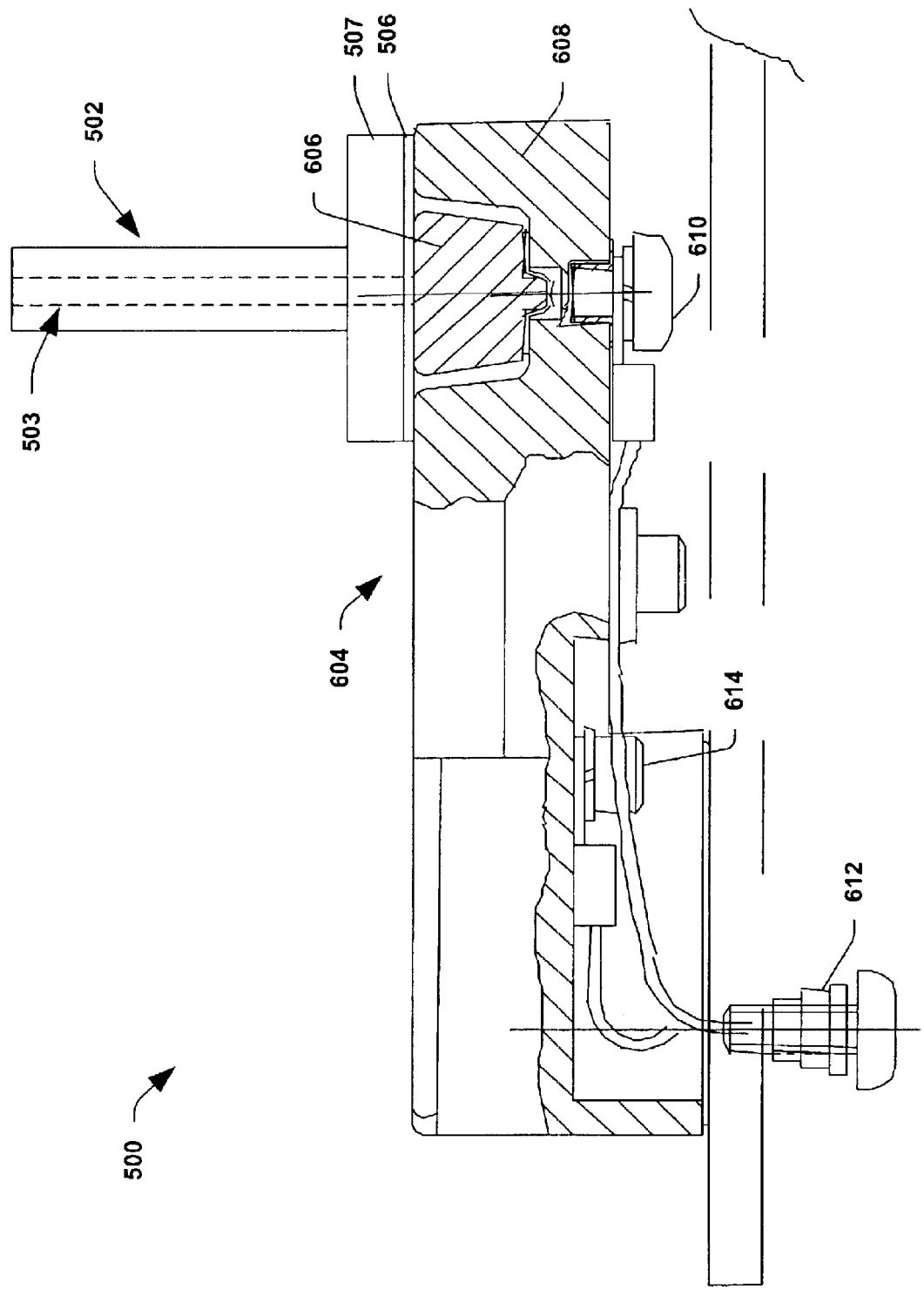
FIG. 6 is a cross sectional view illustrating an exemplary beam incident angle detector in accordance with an aspect of the present invention.

Turning now to FIG. 6, a cross sectional view of a beam incident angle detector 500 is illustrated in accordance with one exemplary aspect of the present invention. The detector 500 includes a tube portion 502, and an aperture 503 therethrough. The aperture 503 extends through a base 507 and an insulating layer 506. The tube portion 502 is grounded so that charged ions that impact upon it lose their charge. The tube portion 502 can be biased to a voltage or to another type of electrical connection so long as the charge of ions that impact the tube portion is at least partially dissipated. Because of the insulating layer 506, the tube 502 is electrically isolated from a charge collector, comprised of a first plate 606 and a second plate, referred to as a receiver 608.

In another alternative, the tube may or may not be grounded or otherwise biased, but instead the tube interior captures or collects ions that strike the interior sidewall thereof. In such an instance, based on the incident ion beam angle with respect to an axis passing through the tube, a select number of ions will reach a charge collector at or near the bottom of the tube while the remaining ions are "collected" by the tube.

In addition to the tube portion 502, the base 507, and the receiver 608, the angle detector 500 also includes a receiver connection 614, and a pickup connection 612 for the receiver 608. A housing 604 for the detector 500 is typically biased to ground and includes a housing pickup connection 614. During operation, the pickups (612 and 614) are utilized via a charge collector mechanism to measure collected charge and thereby obtain peak charge values.

Figure 7:
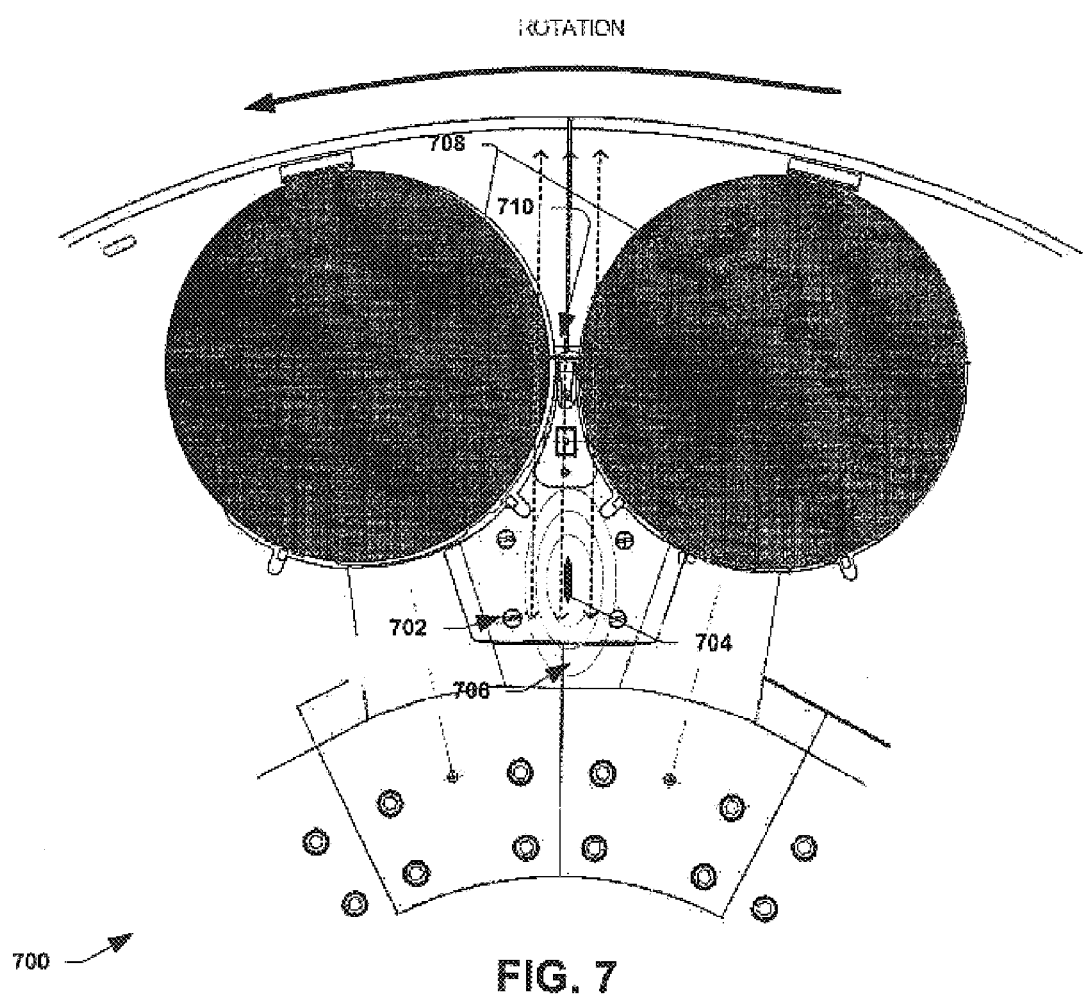
FIG. 7 is a plan view illustrating a portion of a process disk in accordance with an aspect of the present invention.

The detector 502 can be formed of one or more suitable materials. One well-suited material that can be utilized for the detector assembly 500 is aluminum. Thus, the detector assembly 500 can be formed or molded out of one or more pieces of aluminum. Additionally, the beam incident angle detector 500 can be covered/coated with a semiconductor material, such as silicon, so as to avoid sputtering from occurring during ion implantations. Without such a coating, ions impacting the detector could dislodge atoms or molecules (e.g., aluminum) and cause them to deposit elsewhere, by a sputtering type action, at an end station including process wafers themselves. FIG. 7 is a plan view of a portion of a process disk 700 illustrating a path or scanning area of a process disk through an ion beam 702 in accordance with an aspect of the present invention. The process disk 700 scans through the ion beam, in this example, in a vertical and radial direction, as indicated in FIG. 7. A center 704 of the ion beam 702 is substantially comprised of positively charged ions. An outside portion 706 of the ion beam 702 is predominantly comprised of electrons. The ion beam 702 can be utilized for a calibration procedure or for an ion implantation process as part of a semiconductor device fabrication procedure.

The process disk portion 700 includes a pair of wafers 708 and an ion beam angle detector 710. The angle detector 710 is located between the pair of wafers 708 in this aspect of the invention. However, the present invention can locate angle detectors with other locations and configurations as discussed supra.

As the ion beam 702 passes over the angle detector 710, the angle detector 710 first obtains a negative charge due to the outside portion comprised predominantly of electrons 706. As the ion beam 702 continues to pass through the angle detector 710, the charge obtained turns from negative to positive as the center portion 704 of the beam 702, referred to as the beam centroid, which comprises positively charged ions, passes through the angle detector 710. As the ion beam 702 continues, the outside portion once again predominates causing a negative charge to be obtained. A sample charge characterization is described infra.

It is appreciated that the portion of the process disk 700 of FIG. 7 is provided for exemplary purposes and is not intended to limit the invention to a particular implementation. For example, a single wafer platen type system may be employed and is contemplated as falling within the scope of the present invention.

Figure 8:
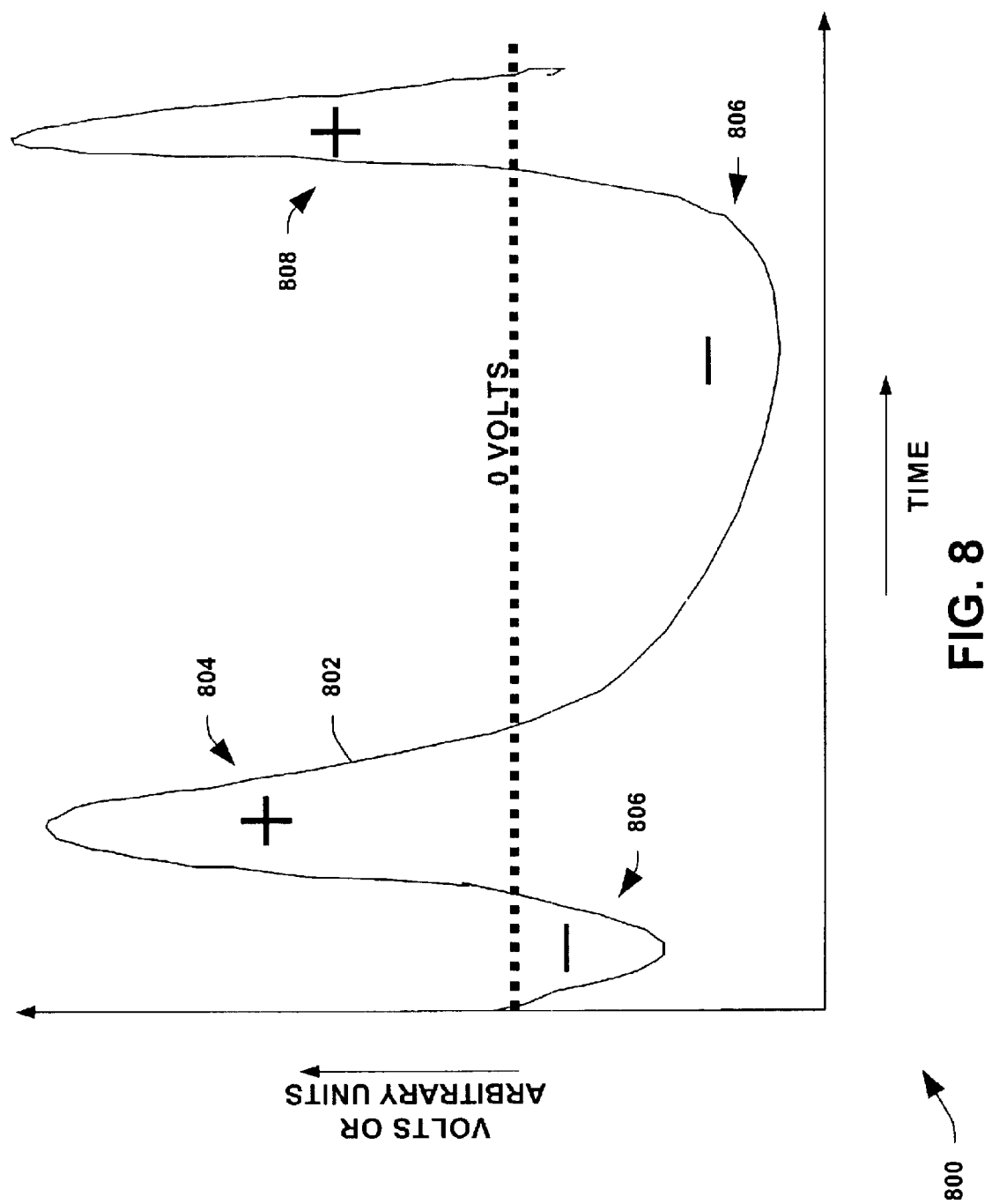
FIG. 8 is a graph illustrating accumulated charge or peak charge values represented by voltage for a beam incident angle detector in accordance with an aspect of the present invention.

FIG. 8 is a graph 800 illustrating accumulated charge on a beam incident angle detector in accordance with an aspect of the present invention. A line 802 on the graph 800 illustrates a pass/scan of an exemplary ion beam through a beam incident angle detector in accordance with the present invention. From this graph 800, a maximum magnitude of charge can be obtained to facilitate identification of possible angular errors. The graph has time as the x-axis, starting from 0 and the y-axis represents a charge/peak charge value. The relative charge values with respect to each other are employed to determine presence of angular error and to determine corrective values.

As the ion beam initially passes through or over the detector, electrons located in the outside region of the beam cause the detector to obtain a negative charge as shown at 806. As the beam progressively passes through the detector, the charge on the detector turns from negative, to positive, to even more positive. Eventually, the center of the beam, which is substantially comprised of positively charged ions, passes over the detector, or the detector passes through the ion beam, with the detector yielding a maximum charge value as shown at 804. Subsequently, the charge is reduced and eventually becomes negative once again as an outer portion of the ion beam, comprised substantially of electrons, passes through or over the angle detector as shown at 806. The process is again repeated as the centroid portion of the ion beam again passes through or over the angle detector at 808.

Figure 9:
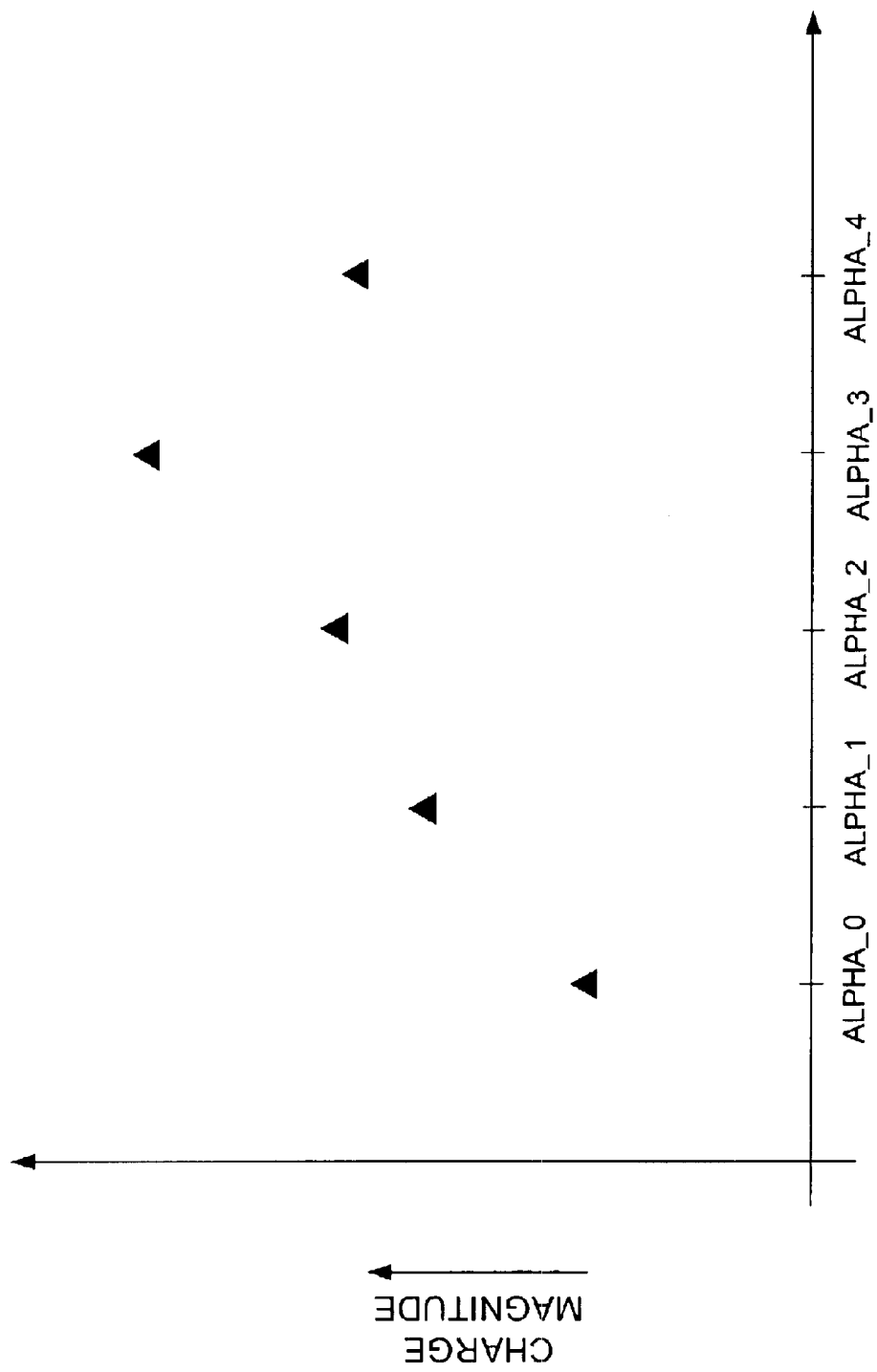
FIG. 9 is a graph illustrating exemplary peak charge values obtained for a number of alpha values in accordance with an aspect of the present invention.

FIG. 9 depicts a graph of exemplary peak charge values obtained via an angle detector for a number of first, or so-called "alpha values", in accordance with an aspect of the present invention. The graph depicts results from a calibration procedure utilizing one or more ion beam angle detectors in accordance with the present invention. A second, or the so-called he beta value is held constant at an un-calibrated value of about zero. The alpha values, ALPHA_0, ALPHA_1, ALPHA_2, ALPHA_3, and ALPHA_4, are various values of alpha offset values. As an example, the alpha values could be set as follows: ALPHA_0=−0.5 degrees, ALPHA_1=0.0 degrees, ALPHA_2=0.5 degrees, ALPHA_3=1.0 degrees, and ALPHA_4=1.5 degrees. A maximum charge value is obtained at each alpha value. Statistical averaging, such as average, mean value, and the like, can be employed to avoid obtaining erroneous maximum charge values.

The graph of FIG. 9 shows ALPHA_3 as providing best charge magnitude value. Consequently, ALPHA_3 is a good candidate for a calibration value since at that angle, the maximum amount of ions were received through the tube down to the top capacitor plate. Once the alpha calibration value is obtained, the end station and, more particularly, the process disk is adjusted to the calibrated value, or offsets are noted for future reference. After the calibration has been applied, a verification procedure can be performed to ensure that the modified alpha value is improved.

Figure 10:
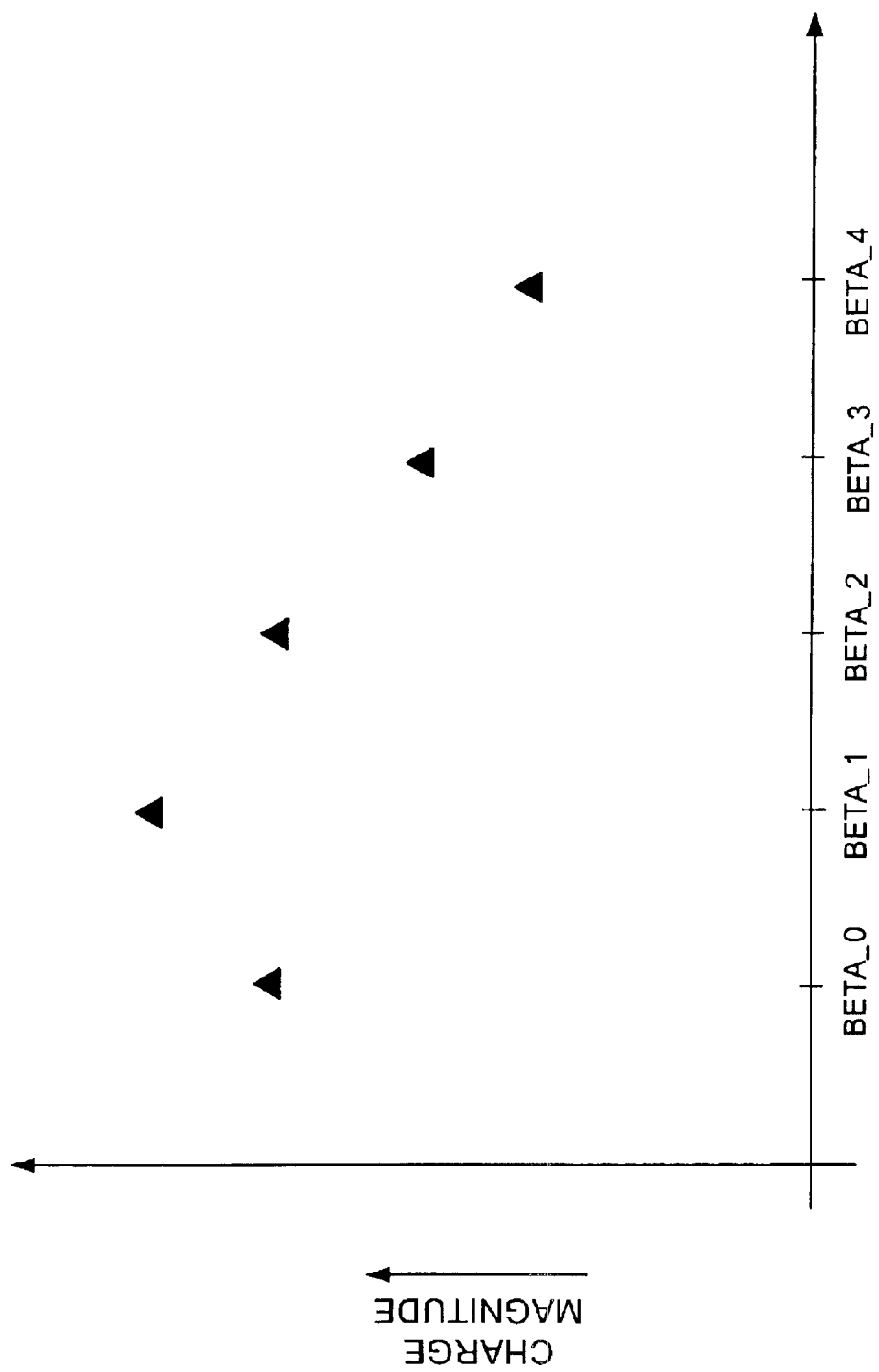
FIG. 10 is a graph illustrating exemplary peak charge values obtained for a number of beta values in accordance with an aspect of the present invention.

FIG. 10 depicts a graph of exemplary peak charge values obtained via an angle detector for a number of beta values in accordance with an aspect of the present invention. The graph results from a calibration procedure utilizing one or more ion beam angle detectors in accordance with the present invention. The alpha value is held constant at an un-calibrated value of about zero. The beta values, BETA_0, BETA_1, BETA_2, BETA_3, and BETA_4, are various values of beta offset values. As an example, the beta values could be set as follows: BETA_0=−1.5 degrees, BETA_1=−1.0 degrees, BETA_2=−0.5 degrees, BETA_3=0.0 degrees, and BETA_4=0.5 degrees. A maximum charge value is obtained at each beta value. Statistical averaging, such as average, mean value, and the like, can be employed to avoid obtaining erroneous maximum charge values.

The graph of FIG. 10 shows BETA_1 as providing a best charge magnitude value. Consequently, BETA_1 is a good candidate for a calibration value. Once the beta calibration value is obtained, the end station and, more particularly, the process disk are adjusted according to the calibrated value. After the calibration has been applied, a verification procedure can be performed to ensure that the modified beta value is improved and/or proper. Subsequently, additional calibration procedures can be performed for both alpha and beta values to further improve the calibration and accuracy of the calibration.

It is appreciated that FIG. 9 and FIG. 10 are presented primarily for illustrative purposes. Other calibrations procedures, alpha values, and beta values can be employed and still be in accordance with the present invention. In addition, it should be noted that the identified alpha and beta angles identify the process disk orientation that is substantially perpendicular to the incident incoming ion beam. In many cases, these alpha and beta angles may be employed to "zero out" the system. Since many process recipes require implantations to be performed at an angle, the alpha and beta angles may be used as a starting point and alpha and beta motor controls are then varied/adjusted in a known manner from that start point or reference determined herein to arrive at the desired implant angle in a substantially controlled and reliable manner.

In view of the foregoing structural and functional features described supra and infra, methodologies in accordance with various aspects of the present invention will be better appreciated with reference to FIGS. 11–13 and 18. While, for purposes of simplicity of explanation, the methodologies of FIGS. 11–13 and 18 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Figure 11:
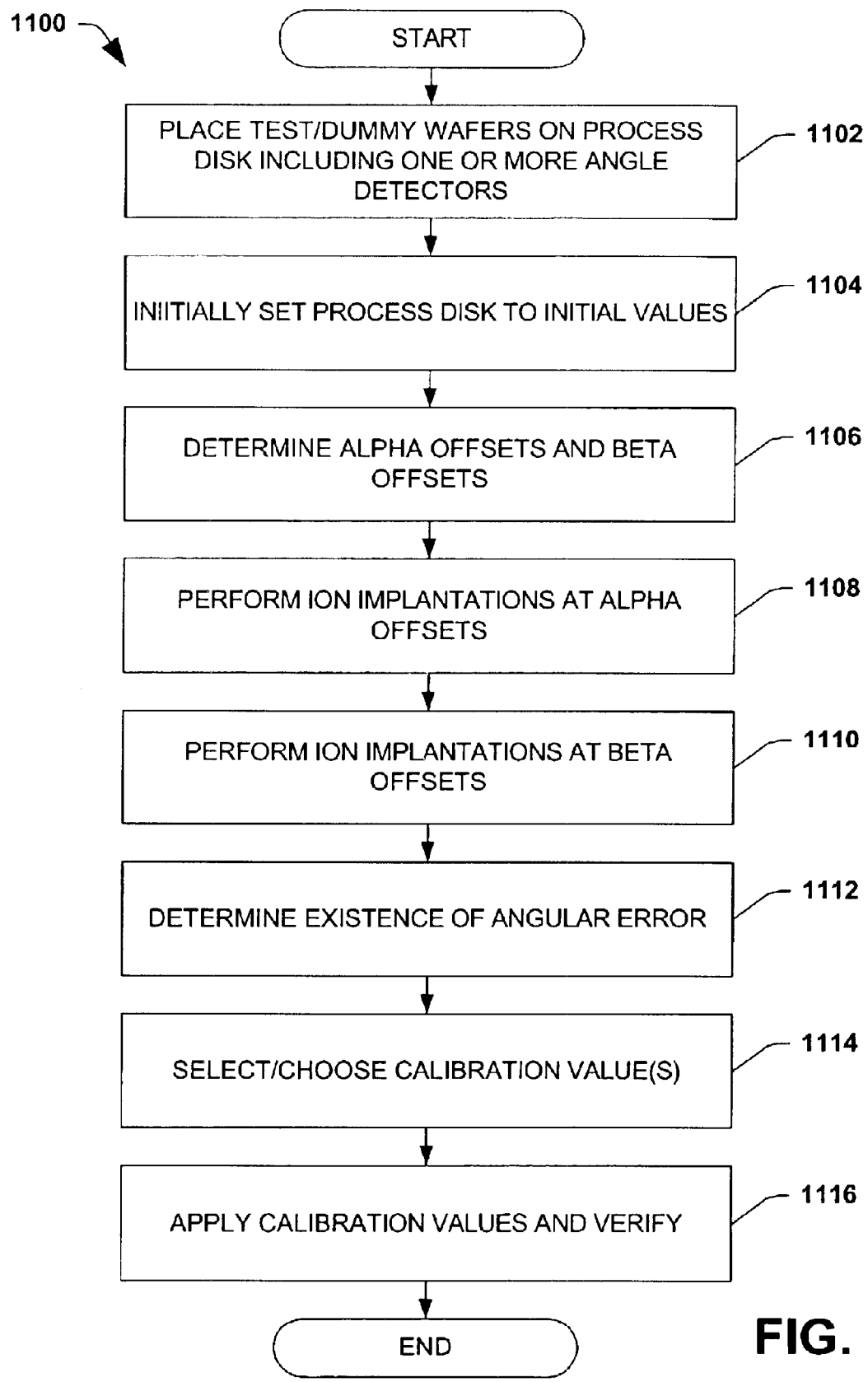
FIG. 11 is a flow diagram illustrating a method of aligning an incident ion beam with a process disk of an ion implantation system in accordance with an aspect of the present invention.

FIG. 11 is a flow diagram illustrating a method 1100 of aligning an incident ion beam with a process disk of an ion implantation system in accordance with an aspect of the present invention. The method 1100 aligns the disk prior to testing and utilizes test/dummy wafers. However, unlike conventional procedures, the method 1100 does not require inspection or measurement of ion implantation results on the test wafers. Additionally, the test wafers can be damaged or otherwise unusable wafers in contrast to test wafers employed in other procedures, such as procedures that require measurement of implant characteristics.

The method 1100 begins at block 1102 wherein a number of test wafers are placed within/on a process disk that includes one or more beam incident angle detectors. The process disk is a component of an end station of an ion implantation system and is rotatable about an axis of rotation. Additionally, the process disk is adjustable about an alpha axis and a beta axis in order to permit various desired angles of implantation. The angle of the alpha axis is related to tilt and the angle of the beta axis is related to twist. The angle detectors are configured and located within a scanning area of the ion beam such that the ion beam passes through the angle detectors during operation, such as is illustrated in FIG. 3. It is appreciated that alternate aspects of the invention can include and are operable with other axes besides alpha and beta axes.

The method 1100 continues at block 1104 where the process disk is initially set or aligned to alpha and beta values of about zero, which should result in an ion beam being substantially normal to the test wafers and the process disk. As discussed supra, the alpha is an adjustment related to tilt and the beta is an adjustment related to twist. More specifically, the tilt is approximately $\sqrt{alpha^2+beta^2}$ and the twist is approximately the $\arctan(-beta/alpha)+delta$, wherein alpha, beta and delta are orthogonal axes (delta being a notch aligner offset around the wafer normal). Thus in simplified instances, the alpha angle can be equated with tilt and the beta angle can be equated with twist. As a result, alpha and beta values of zero yield an ion beam substantially normal to the process disk and should, but for calibration or angular error, yield the greatest detected charge by the angle detectors.

A plurality of alpha offsets and beta offsets are determined at block 1106, along with other ion implantation process parameters. The alpha and beta offsets are a range of incremental adjustments of alpha values, such as those described with respect to FIGS. 9–10. The offset values are chosen based upon an expected amount of angular error. Thus, if it is expected that there exists a large angular error, larger offset values are chosen. Otherwise, if a relatively small angular error is expected, smaller offset values are chosen. Additionally, the number of alpha and beta offset values can vary depending on expected angular error. It is appreciated that a greater number of offset values are more likely to identify angular error and to obtain a suitable calibration factor. The ion implantation process parameters include, for example, energy of implant, beam width, dose, duration, and the like. Typically, the implantation process parameters are selected so as to be substantially similar to those used in device fabrication implantation procedures. However, the process parameters can be tailored to facilitate angular error detection (e.g., by setting a beam width about equal to an aperture of the angle detectors).

With the beta angle maintained constant at about zero, ion implantation is performed at the plurality of alpha offsets and charge measurements are obtained from the one or more beam incident angle detectors at block 1108. A peak charge value is determined for each ion implantation and alpha offset value resulting in a plurality of alpha peak charge values. The peak charge value is not necessarily the maximum charge detected during implantation, but can be statistically derived as an average value, average maximum charge, mean maximum charge value, and the like.

With the alpha angle maintained constant at about zero, ion implantations are performed at the plurality of beta offsets and charge measurements are obtained from the one or more beam incident angle detectors at block 1110. A peak charge value is determined for each ion implantation and beta offset value resulting in a plurality of beta peak charge values. The beta peak charge value is not necessarily the maximum charge detected during implantation, but can be statistically derived as an average value, average maximum charge, mean maximum charge value, and the like.

At block 1112, a determination is made as to whether or not a calibration or angular error exists based on the alpha peak value charges and the beta peak value charges. As discussed previously, the maximum values obtained should be at alpha and beta equal to zero if the ion implantation is devoid of angular errors. Otherwise, angular error or calibration error is present and should be corrected. Next, if an angular error is found to exist, an alpha calibration value is chosen as that value of the plurality of alpha offset values that yielded the largest of the alpha peak values and a beta calibration value is chosen as that value of the plurality of beta offset values that yielded the largest of the beta peak values at block 1114.

At block 1116, the alpha calibration value and the beta calibration value are applied to the orthogonal axes (e.g., tilt and twist in some instances), respectively, and a verification process is performed. The verification process can simply be performance of an ion implantation to verify that similar peak charge values are obtained or, alternately, can employ a number of alpha and beta offset values. If the verification is successful, the method ends and the ion implantation system is considered properly calibrated. Otherwise, the method returns to block 1104 where the where the process disk is once again initialized to alpha and beta values of zero.

It is appreciated that variations of the method 1100 are contemplated and in accordance with the present invention. For example, the process disk can be initialized to other values instead of zero and both the alpha and beta offsets can vary for each implantation instead of holding one constant. Additionally, charge data obtained by the angle detectors can be stored in a database, along with other information such as the alpha and beta values and ion implantation process parameters so as to be utilized in situ and/or for other calibration procedures. Thus, the peak charge values can be compared with those in the database to substantiate and correlate the calibration values. For another example, the method 1100 can align the process disk with a first axis and a second axis, where the first axis and the second axis are not necessarily tilt and twist axes.

Figure 12:
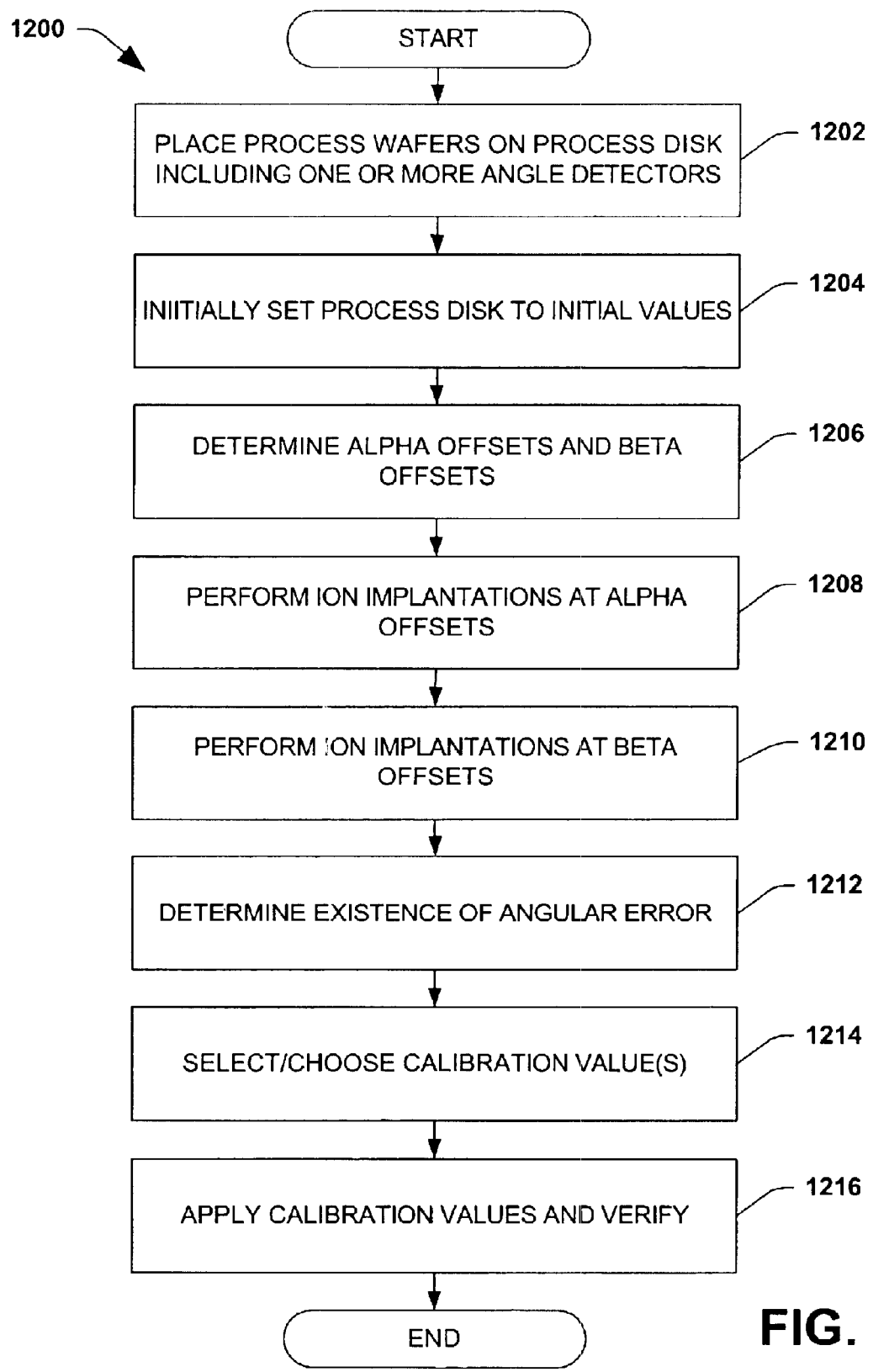
FIG. 12 is a flow diagram illustrating a method of aligning an incident ion beam with a process disk of an ion implantation system in accordance with an aspect of the present invention.

FIG. 12 is a flow diagram illustrating a method 1200 of aligning a process disk in accordance with an aspect of the present invention. The method 1200 aligns the process disk prior to testing and does not require test wafers. Process wafers, meaning those wafers, that will be subsequently implanted and have devices fabricated thereon, are positioned on the process disk prior to beginning the method 1200. One or more angle detectors are located on the process disk, but are located outside of the normal scanning area of the ion beam. This configuration permits calibrating the process disk without negatively affecting the process wafers because the ion beam angle detectors are outside of the wafer process area. Thus, an ion beam is directed at an area, which covers or includes the angle detectors but excludes the process wafers. The method 1200 is similar to the method 1100 of FIG. 11 and, as such, some detail is omitted for brevity.

The method 1200 begins at block 1202 wherein a number of process wafers are placed on a process disk that includes one or more beam incident angle detectors. The process disk is a component of an end station of an ion implantation system and is rotatable about an axis of rotation. Additionally, the process disk is adjustable about one or more axes in order to permit various desired angles of implantation. The angle of the tilt axis is referred to as alpha and the angle of the twist axis is referred to as beta in this particular example. The angle detectors are configured and located outside the typical scanning area of the ion beam such that the ion beam passes through the angle detectors during operation without impacting the process wafers. One example of a suitable configuration for the one or more angle detectors is illustrated in FIG. 4.

The method 1200 continues at block 1204 where the process disk is initially set or aligned to alpha and beta values of about zero that should result in an ion beam being substantially normal to the test wafers and the process disk. These values yield an ion beam substantially normal to the process disk and should, but for calibration or angular error, yield the greatest detected charge by the angle detectors.

A plurality of alpha offsets and beta offsets are determined at block 1206, along with other ion implantation process parameters. The alpha and beta offsets are a range of incremental adjustments of alpha values, such as those described with respect to FIGS. 9–10. The offset values are chosen based upon an expected amount of angular error. Additionally, the number of alpha and beta offset values can vary depending on expected angular error. It is appreciated that a greater number of offset values are more likely to identify angular error and to obtain a suitable calibration factor. The ion implantation process parameters include, for example, energy of implant, beam width, dose, duration, and the like. Typically, the implantation process parameters are selected so as to be substantially similar to those used in device fabrication implantation procedures. However, the process parameters can be tailored to facilitate angular error detection (e.g., by setting a beam width about equal to an aperture of the angle detectors).

With the beta angle maintained constant at about zero, ion implantation is performed at the plurality of alpha offsets and charge measurements are obtained from the one or more beam incident angle detectors at block 1208. A peak charge value is determined for each ion implantation and alpha offset value resulting in a plurality of alpha peak charge values. The peak charge value is not necessarily the maximum charge detected during implantation, but can be statistically derived as an average value, average maximum charge, mean maximum charge value, and the like.

With the alpha angle maintained constant at about zero, ion implantation is performed at the plurality of beta offsets and charge measurements are obtained from the one or more beam incident angle detectors at block 1210. A peak charge value is determined for each ion implantation and beta offset value resulting in a plurality of beta peak charge values. The beta peak charge value is not necessarily the maximum charge detected during implantation, but can be statistically derived as an average value, average maximum charge, mean maximum charge value, and the like. It is appreciated that the present invention includes performing ion implantations at various alpha and beta offset values simultaneously and is not limited to performing ion implantations for alpha offsets with beta equal to zero and performing ion implantations for beta offsets with alpha equal to zero.

At block 1212, a determination is made as to whether or not a calibration or angular error exists based on the alpha peak value charges and the beta peak value charges. As discussed previously, the maximum values obtained should be at alpha and beta equal to zero if the ion implantation is devoid of angular errors. Otherwise, angular error or calibration error is present and should be corrected. Next, on angular error existing, an alpha calibration value is chosen as that value of the plurality of alpha offset values that yielded the largest of the alpha peak values and a beta calibration value is chosen as that value of the plurality of beta offset values that yielded the larges of the beta peak values at block 1214.

At block 1216, the alpha calibration value and the beta calibration value are applied to the alpha and beta axes, respectively, and a verification process is performed. The verification process can simply be performance of an ion implantation to verify is similar peak charge values are obtained or, alternately, can employ a number of alpha and beta offset values. If the verification is successful, the method ends and the ion implantation system is considered properly calibrated. Otherwise, the method returns to block 1204 where the where the process disk is once again initialized to alpha and beta values of zero.

It is appreciated that variations of the method 1200 are contemplated and in accordance with the present invention. For example, the process disk can be initialized to other values instead of zero and both the alpha and beta offsets can vary for each implantation instead of holding one constant. Additionally, charge data obtained by the angle detectors can be stored in a database, along with other information such as the alpha and beta values and ion implantation process parameters so as to be utilized in situ and/or for other calibration procedures. Thus, the peak charge values can be compared with those in the database to substantiate and correlate the calibration values.

Figure 13:
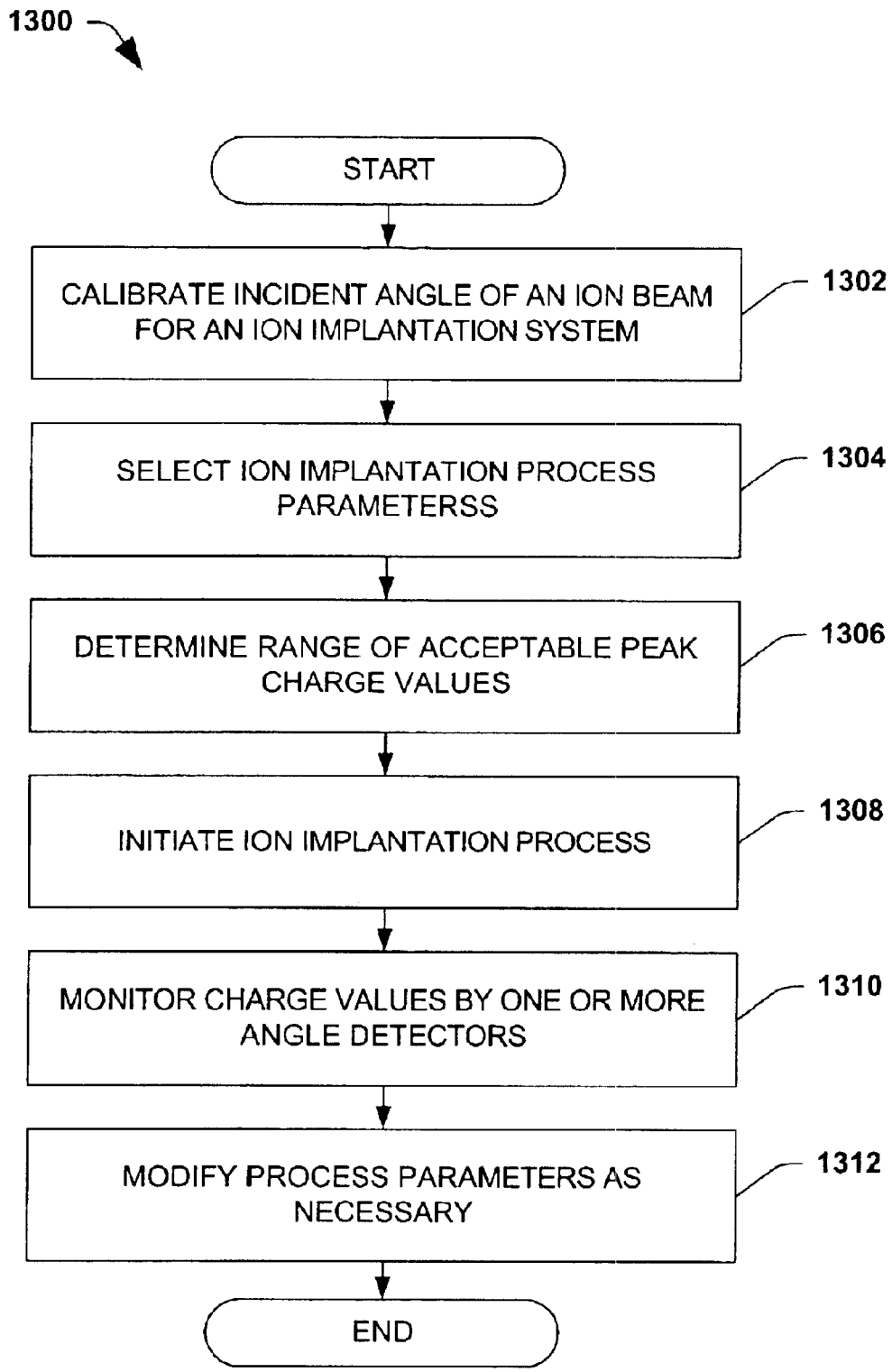
FIG. 13 is a flow diagram illustrating a method of aligning an incident ion beam with a process disk of an ion implantation system in situ in accordance with an aspect of the present invention.

FIG. 13 is a flow diagram illustrating a method 1300 of aligning a process disk on an end station in situ in accordance with an aspect of the present invention. The method 1300 employs one or more ion beam angle detectors to detect/monitor variations in charge buildup from expected values during an ion implantation procedure. The obtained charge data, referred to as feedback data, can be utilized to make minor adjustments in alpha and beta angles and therein facilitate performance of the ion implantation process.

The method 1300 begins at 1302 by initially aligning or calibrating the incident angle of an ion beam for an ion implantation system. A suitable calibration procedure, such as discussed supra, can be utilized to align the system. At 1304, ion implantation process parameters are selected and/or determined for a stage of semiconductor device implantation. The stage can be forming active regions, forming a well, forming a conductive layer and/or other types of semiconductor structures that require implanting of a dopant. The process parameters include parameters such as energy level, dopant, dose, angle of implant, and the like.

The process parameters, particularly the angle of implant, are employed at 1306 along with angle implantation charge data to determine a range of acceptable and non-acceptable charge values for the one or more ion beam angle detectors. The angle implantation charge data can comprise data from previous ion implantation and/or calibration procedures. Additionally, the angle implantation charge data can be compiled by running a test ion implantation procedure while monitoring charge via the one or more ion beam angle detectors and verifying calibration after the test implantation.

Continuing at 1308, an ion implantation is initiated in accordance with the ion implantation process parameters determined or selected supra. During the ion implantation, charge values are monitored by the one or more ion beam angle detectors at 1310. On the charge values exceeding the range of acceptable values, which indicates angular error, the ion implantation process parameters are appropriately modified to correct the angular error at 1312.

It is appreciated that a variation of this method 1300 in which beam current as a function of angle of incidence is measured by the angle detectors and employed in place of charge values.

Figure 14:
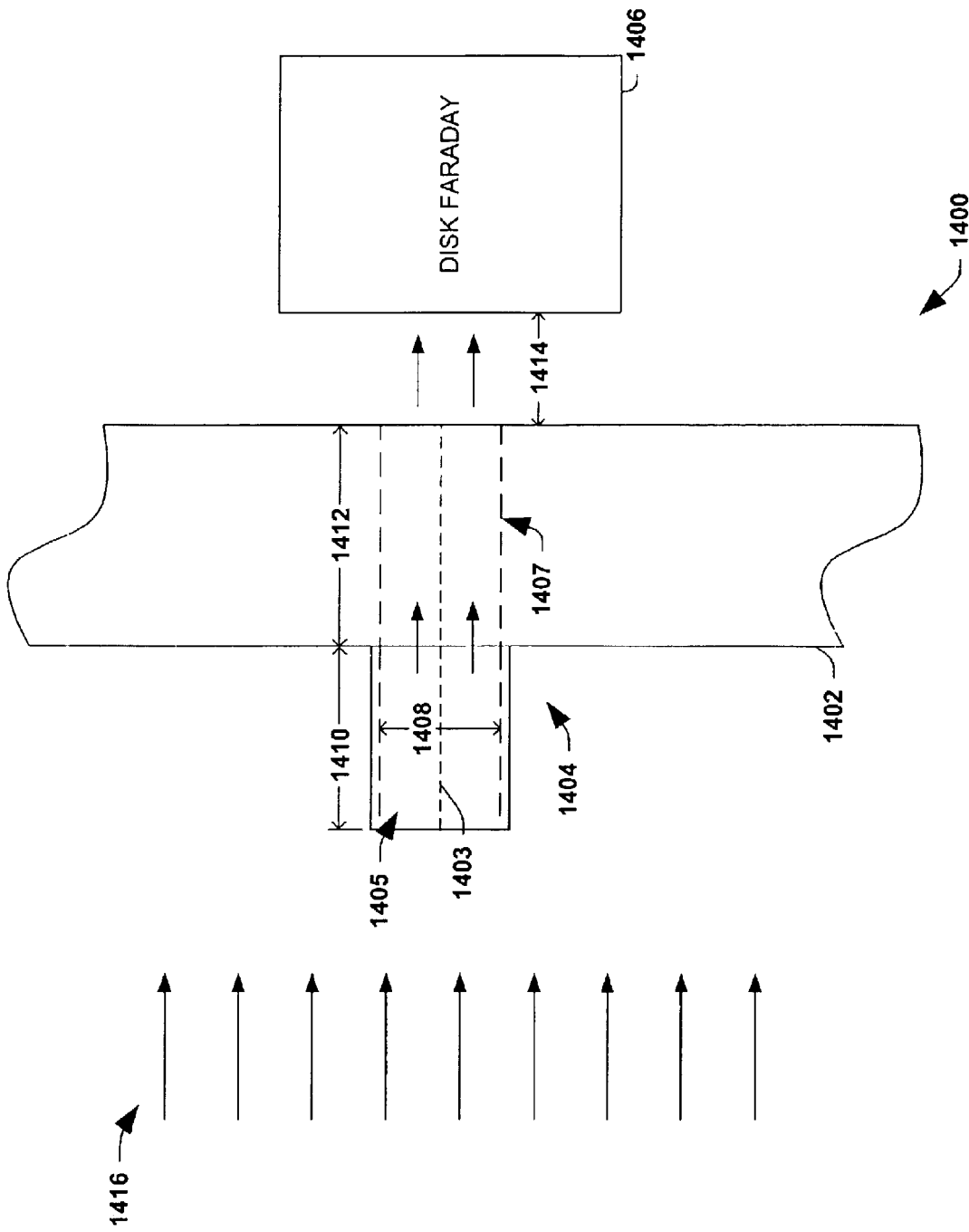
FIG. 14 is a cross sectional view illustrating a beam incident angle detector in accordance with an aspect of the present invention.

Turning now with FIG. 14, a cross sectional view of a beam incident angle detector 1400 in accordance with another aspect of the present invention is illustrated. The angle detector 1400 detects and/or identifies angular error of an ion beam for ion implantation systems by measuring beam current as a function of the beam incident angle. The angle detector 1400 is located in/on or near a process disk 1402 of an end station in a process area where wafers are generally located. The angle detector 1400 can be one of a number of beam incident angle detectors located on the process disk 1402 or the angle detector 1400 can be the only angle detector located on a process disk 1402. Again, while the illustrated example is provided in the context of a batch type end station, it should be understood that single-wafer type end stations are also contemplated by the present invention.

The angle detector 1400 includes a tube portion 1404 and a faraday 1406. An aperture 1405 extends through the tube portion 1404 and a profile hole 1407 in the process disk 1402 that permits charged ions from an ion beam 1416 to pass through to the faraday 1406, which measures beam current, or another suitable type of sensor. The tube 1404 is comprised of a conductive material such as a metal (e.g., aluminum) and is connected to ground.

Initially, charged ions enter the aperture 1405 and begin to pass through the tube 1404. If the charged ions from the beam 1416 are not traveling substantially in line or parallel with an axis 1403 the tube 1404 but at an angle or offset from the axis 1403, at least a portion of the charged ions will impact the interior sidewalls of the tube 1404 and consequently come to rest in the sidewall material or lose their charge. The charged ions that pass through the aperture 1405 impact the faraday 1406. Ions from the beam 1416 that have impacted the interior sidewalls of the tube 1404 can still pass through the aperture 1405 and strike the faraday 1406, they fail to substantially contribute to the measured beam current because impacting the interior of the tube 1404 has dissipated their charge. Generally, the greater the angle of incidence is offset with respect to the axis 1403, the less beam current is measured. Consequently, a greater magnitude of measured beam current indicates a superior angle of incidence, that is, the beam is substantially parallel with the axis 1403.

The angle detector 1400 has an aspect ratio defined as a ratio of the aperture length to an aperture width 1408. The aperture length is defined by an exterior portion length 1410 and a depth 1412 through the process disk. The aspect ratio should be selected such that an adequate and/or minimum number of ions pass through the aperture 1405 and that misalignment relative to a surface is discernable. Generally, the dimensions, exterior portion length 1410, depth 1412, and width 140 are selected so that enough ions pass through to obtain a sufficient signal (beam current) without losing the accuracy of the alignment or misalignment. Additionally, the tube 1404 is illustrated as being cylindrical, however the present invention contemplates that a variety of cross-sectional shapes and/or dimensions (e.g., circles or other polygons) are suitable for the tube 1404 so long as they permit sufficient signal strength and selection of aspect ratio. If the process disk 1402 is sufficiently thick, the hole therethrough may have a sufficient aspect ratio so as to avoid additionally requiring a tube or other structure to attain a sufficient aspect ratio. In addition, although FIG. 14 illustrates a tube on a front face of the process disk, such a tube may also reside on the back face thereof. Further, although a tube is employed in one example to generate an aperture with a sufficient aspect ratio, any material having a hole therethrough aligned with a profile hole in the process disk may be employed and is contemplated by the present invention. Additionally, although the tube portion 1404 and the profile hole 1407 are illustrated as having identical aperture widths, variations in width are contemplated by the present invention, so long as the resulting aperture yields a strong enough beam current and a suitable signal to noise ratio. Furthermore, the tube portion 1404 and the profile hole 1407 are collectively one example of a suitable beam discriminating structure in accordance with the present invention.

The faraday 1406, in one example, is a stationary faraday located downstream of the tube 1404. Alternatively, the faraday 1406 may rotate with the process disk 1402. In any event, during operation the faraday 1406 measures beam current based on ions from the ion beam 1416 that pass through the aperture 1405 and maintain their charge. The faraday is typically used for dose control during ion implantations. For each positive ion from the ion beam that enters the faraday 1406, an electron is drawn from ground through a current meter to neutralize the positive charge of the ion. The current meter measures a beam current based on the number of electrons drawn. A magnetic field stops outside secondary electrons from entering and secondary electrons produced inside from exiting.

The faraday 1406 is located a suitable distance 1414 away or downstream from the process disk 1402 and tube 1404. The distance 1414 can range from about zero (an on-disk faraday) to another suitable distance, according to the particular implementation.

The angle detector 1400 can be employed in the methods described supra by measuring beam current instead of charge values.

Figure 15:
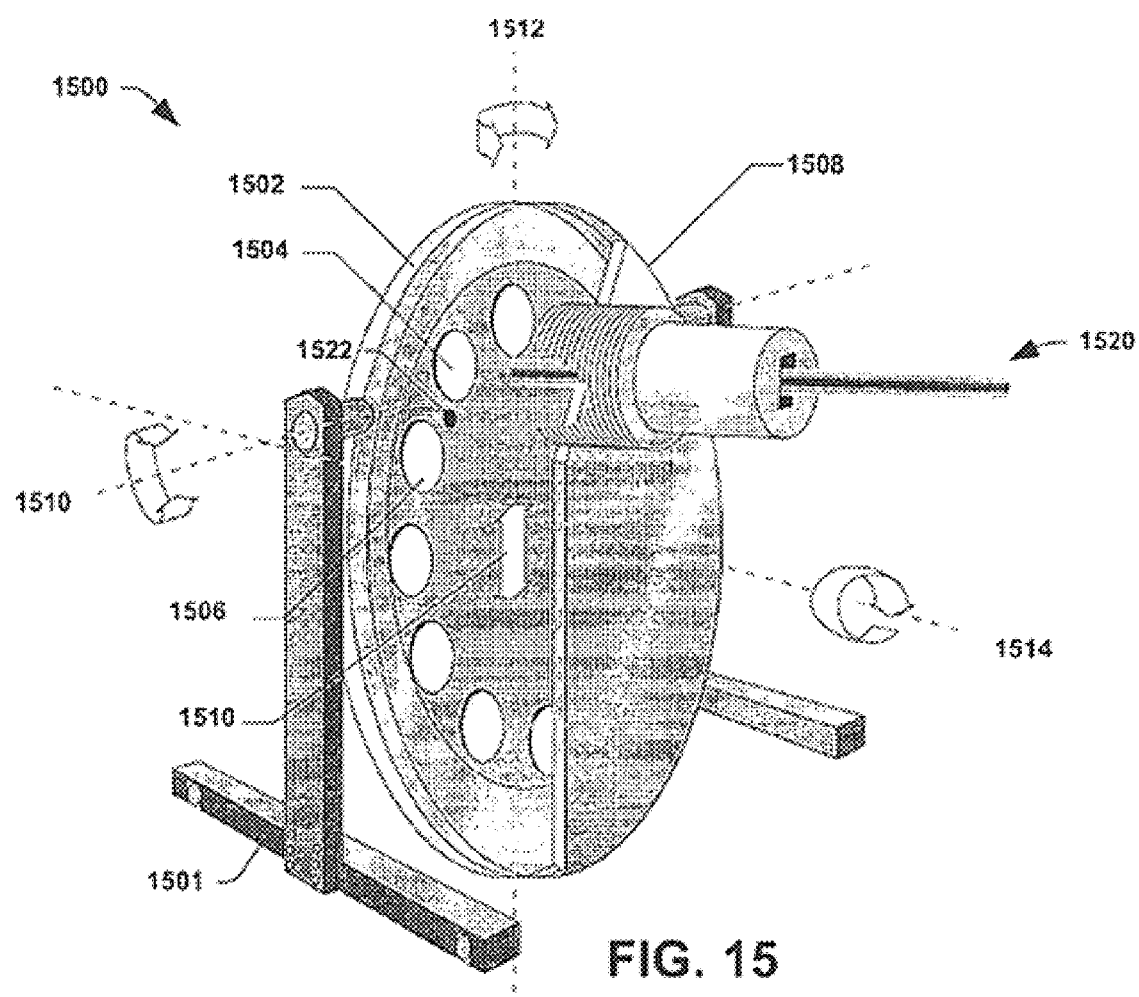
FIG. 15 is a perspective view illustrating an end station of an ion implantation system having a beam incident angle detector in accordance with an aspect of the present invention.

Continuing on with FIG. 15, a perspective view of an end station 1500 for an ion implantation device is depicted in accordance with an aspect of the present invention. The end station 1500 is operable to be calibrated and adjusted in situ in accordance with the present invention. The end station 1500 permits and performs substantially accurate ion implantation procedures therein facilitating semiconductor device fabrication.

The end station 1500 at least partially includes a process chamber 1502 and a chamber mount 1501, which support the process chamber 1502. The process chamber 1502 comprises a process disk 1504 that holds a number of wafers 1506 and flexible stainless bellows 1508 (or other form of flexible coupling) allows the end station to move in alpha and beta with respect to the ion beam. The wafers 1506 are located on the process disk within a scan/process area or region in which an ion beam can pass into during an implantation procedure. The process disk 1504 is rotatable about an alpha axis 1510 and a beta axis 1512. During operation of a typical ion implantation process, the process disk rotates about an axis of rotation 1514 at speeds that can vary upon the particular device being fabricated and the ion implantation being performed. An exemplary rotational speed is 1200 rotations per minute (rpm), however other suitable rotational speeds can be employed and still be in accordance with the present invention. During operation of an ion implantation process, an ion beam 1520 is scanned across the process disk 1504 in a vertical direction 1510. Thus, the ion beam 1520 is swept across the wafers 1506, which are located in the area scanned by the ion beam.

The process disk 1504 additionally includes one or more beam angle detector(s) 1522 formed on and/or through the process disk 1504, which provide a measurement of beam current that is a function of the ion beam's 1520 angle with respect to the process disk. The angle detectors 1522 can be located within the scan area or, alternately, can be located in an area reachable by the ion beam 1520 but outside of the typical scan/process area. The ion beam 1520 also scans across the one or more beam angle detectors 1522. Again, although the present example illustrates a batch type end station, the present invention is equally applicable to a single-wafer type application.

Semiconductor device fabrication processes typically include ion implantation procedures that require performance/implantation at specific angles. As stated supra, the process disk 1504 is rotatable about the alpha axis 1510 and the beta axis 1512. This property permits a wafer to be implanted at a controlled angle by modifying alpha and beta angles, associated with the alpha axis 1510 and the beta axis 1512, respectively. Prior to performing an ion implantation process, the process disk 1504 can be calibrated, generally for alpha and beta angles of zero that represent a beam normal to the workpiece. A number of suitable mechanisms can be employed to perform this calibration and are discussed supra with respect to FIG. 1.

Another suitable mechanism is to employ the beam angle detector(s) 1522 in order to calibrate the process disk 1504. The beam angle detectors 1522 comprise an aperture having a sufficient aspect ratio and a faraday, and permit ions from the ion beam to pass therethrough and strike the detector/faraday. In one example, the aperture is a hole in the process disk 1504 and a tube that collectively have an aspect ratio selected to facilitate accuracy, signal strength, and signal to noise ratio. The angle detectors 1522 measure beam current or another suitable parameter/signal as a function of an angle of incidence of the ion beam 1520. Additionally, a current-to frequency conversion board (not shown) processes signals/values received from the beam angle detectors 1522. The current-to frequency conversion board can be similar to a charge monitor board, and processes and determines average, peak, and the like beam current values from the beam angle detectors 1522 individually and/or collectively. It will be understood that various signal monitoring and/or computational devices and/or algorithms could be used in the actual implementation of the angle detection system in accordance with the present invention.

A number of process recipes, that include variations on alpha and beta angles, are determined. As one example, the process recipes include a range of varied beta values while alpha is held constant, and include a range of varied alpha values while beta is held constant. However, it is appreciated that other ranges and values can be employed in accordance with the present invention. Then, ion implantations are performed according to the number of process recipes. During these ion implantations, beam current is obtained from the beam angle detector(s) 1522. This beam current data is then employed to determine if there exists a calibration error, also referred to as an angular error, and if so, determine alpha and beta calibration factors. It is appreciated that this mechanism does not require measuring or inspecting of the wafers in order to detect and/or correct calibration errors. Additionally, it is appreciated that the presence of wafers are not necessary for purposes of calibration, but can be present for convenience and/or to protect sensitive surfaces on the process disk that hold the wafers from damage via ion beam(s). Thus, the present invention includes performing the above calibration with or without wafers present.

Subsequent to calibration, an ion implantation process can be performed. If test, dummy or previously used wafers were employed for calibration, the process wafers are now inserted onto the process disk 1504; otherwise the process wafers are already in place. Once the ion implantation process has begun, the one or more beam angle detector(s) 1522 provide feedback data. From this feedback data, measured beam current can be compared to an expected measured beam current thereby providing an indication of a calibration or angular error during the ion implantation process. A database of previously measured beam currents during similar ion implantation procedures can be employed, or alternatively and preferably, an intelligent control system can be employed in an iterative process to determine the offsets required to achieve alpha and beta offsets. Some errors can be corrected by adjusting the alpha and beta angles by appropriate offset amounts. Control signals (not shown) can be sent to alpha and beta motors (not shown) to appropriately adjust the alpha and beta angles. Other errors can indicate a more serious problem and can initiate a suitable corrective action, such as terminating the test. However, it is appreciated that some angular errors can have a severity such that the wafers are damaged and not recoverable. Yet, even in such a case, early detection of severe implantation errors can prevent unnecessary continued processing of the un-recoverable devices/wafers.

Figure 16:
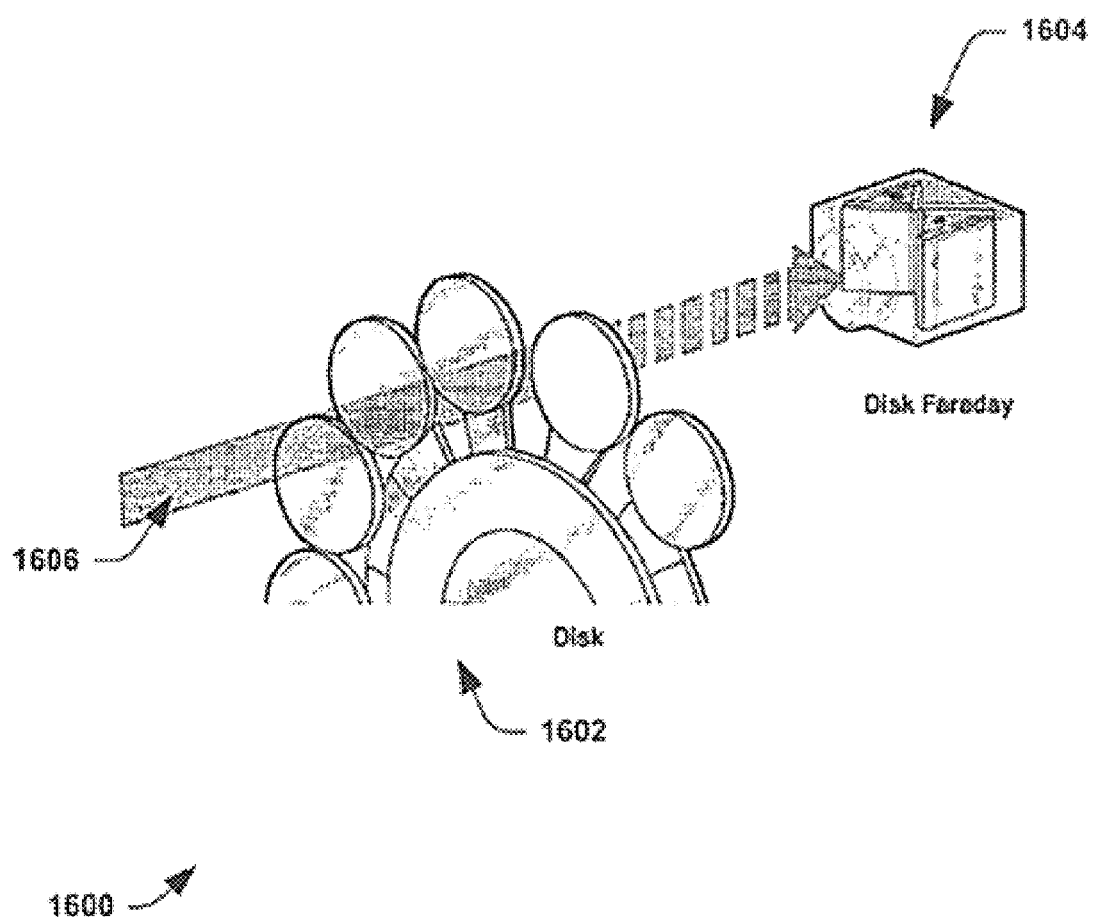
FIG. 16 is a perspective view illustrating an end station of an ion implantation system having a beam incident angle detector in accordance with an aspect of the present invention.

FIG. 16 is a diagram illustrating a perspective view of an end station 1600 for an ion implantation system in accordance with an aspect of the present invention. The end station 1600 permits and performs substantially accurate ion implantation procedures therein facilitating semiconductor device fabrication.

The end station 1600 includes a process disk 1602 and a faraday 1604. The process disk 1602 holds a plurality of wafers (e.g., test wafers, process wafers, and the like) and rotates with a selected rotational speed. The faraday 1604 is located behind the process disk 1604 and measures beam current for an ion beam 1606. The beam current measured is based on charged ions that pass through slots, holes, or angle detectors on and through the process disk 1602 as described above.

The faraday 1604 is stationary or alternatively may rotate with the process disk and can be employed for dosage control during or prior to performing an ion implantation procedure. Additionally, the faraday 1604 can be employed to measure beam current through one or more angle detectors in accordance with the present invention. The measured beam current is generally at a relative maximum value when alpha and beta offset values are zero (e.g., the incident ion beam is normal to the process disk).

Figure 17:
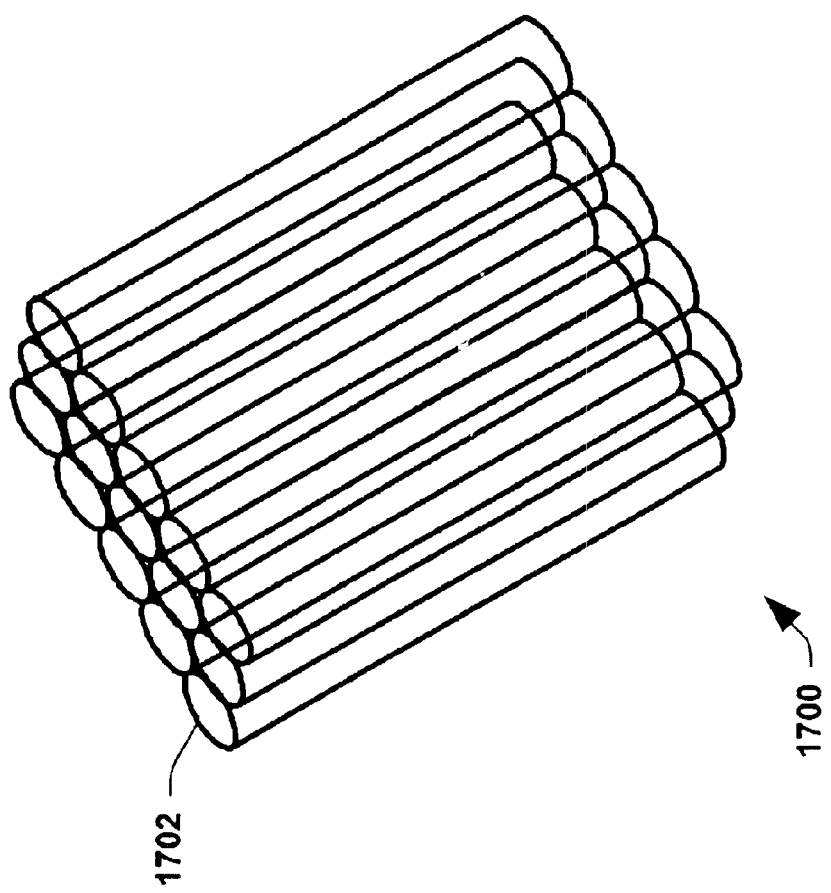
FIG. 17 is a perspective view illustrating an array of tubes for use in angle detector(s) in accordance with an aspect of the present invention.

FIG. 17 is a diagram of a perspective view of an array of tubes 1700 attachable to a portion of an angle detector on/in a process disk in accordance with an aspect of the present invention. The array of tubes 1700 can be employed as a portion of one or more angle detectors of the present invention (see e.g., FIG. 1 and FIG. 14).

The array of tubes 1700 can be used in a manner similar to the single tube described supra. Thus, each tube 1701 has an aspect ratio chosen to increase a signal while reduce noise of the signal (e.g., charge, beam current). For a charge collector type monitor (e.g., FIG. 1), the array of tubes 1700 can be affixed to a single charge collector type sensor so as to increase charge buildup on the collector without substantially increasing noise. Alternately, each tube of the array of tubes 1700 can be attached to a separate charge collector sensor therein providing a plurality of angle detectors equal in number to the number of tubes in the array 1700.

The array of tubes 1700 can also be attached to a process disk or formed within a process disk so as to measure beam current as a function of angle of incidence. The process disk has profile holes or profile apertures that correspond to and are in line with the array of tubes so as to collectively define aspect ratios for the angle detector(s). Similarly, a single disk faraday can be employed to measure a collective beam current through the array of tubes 1700.

The array of tubes 1700 is depicted for illustrative purposes. It is appreciated that other suitable structures having apertures can be used in accordance with the present invention.

In one example, the array of tubes extends radially along a radius of the process disk, wherein the array as a whole has a radial extent that is at least as large as the beam height or diameter. In such an example, the total beam current that passes the array and is collected or detected is greater if a large fraction or portion of the beam is parallel or nearly parallel to the aperture normals. Then, by adjusting the process disk using the gyro motors and collecting beam current data for such variations, information regarding the fraction of the beam versus angle can be ascertained.

In another variation of the above example, arrays having differing aspect ratios may be employed to collect additional information. For example, if a radially extending array has extremely large aspect ratios such that the angle between the ion beam trajectory and the aperture normals for which current can pass therethrough is much smaller than the angular spread of the beam, the beam current versus angle information may be employed to calculate or map the fraction of the beam with a trajectory parallel to the disk normal versus alpha and beta angles. This information may then be utilized to align the disk normal with the average beam direction. In the other example, if the aspect ratio of the apertures is small such that the angle between the ion trajectory and the aperture normals for this current can pass is comparable or greater than the angular spread of the beam, then maximizing the beam current by varying disk angles will align the disk normal with the current weighted average beam direction.

Figure 18:
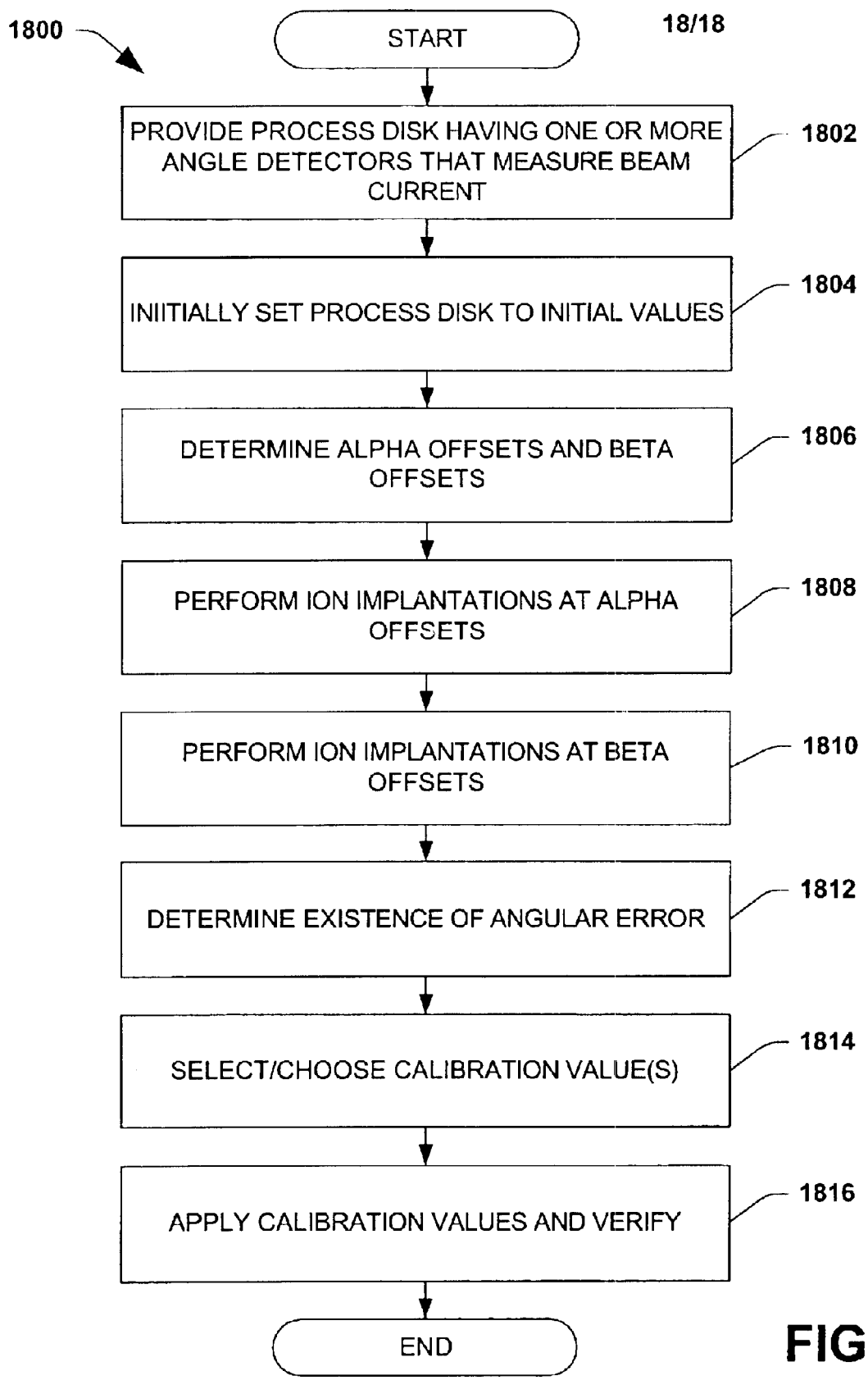
FIG. 18 is a flow diagram illustrating a method of aligning an incident ion beam with a process disk of an ion implantation system in accordance with an aspect of the present invention.

FIG. 18 is a flow diagram illustrating a method 1800 of aligning a process disk in accordance with an aspect of the present invention. One or more angle detectors are located on a process disk and can be located inside or outside of a normal scanning area of the ion beam. The method 1800 is similar to methods 1100 of FIG. 11, 1200 of FIG. 12, and 1300 of FIG. 13 and, as such, some detail is omitted for brevity.

The method 1800 begins at block 1802 wherein a process disk that includes one or more beam incident angle detectors is provided. The process disk is a component of an end station of an ion implantation system and is rotatable about an axis of rotation. Additionally, the process disk is adjustable about a tilt axis and a twist axis in order to permit various desired angles of implantation. The angle of the tilt axis is referred to as alpha and the angle of the twist axis is referred to as beta.

The method 1800 continues at block 1804 where the process disk is initially set or aligned to alpha and beta values of about zero (or other initial offset values) that should result in an ion beam being substantially normal to the process disk. These values yield an ion beam substantially normal to the process disk and should, but for calibration or angular error, yield the greatest measured ion beam by the angle detectors.

A plurality of alpha offsets and beta offsets are determined at block 1806, along with other ion implantation process parameters. The alpha and beta offsets are a range of incremental adjustments of alpha values, such as those described with respect to FIGS. 9–10. The offset values are chosen based upon an expected amount of angular error. Additionally, the number of alpha and beta offset values can vary depending on expected angular error. It is appreciated that a greater number of offset values are more likely to identify angular error and to obtain a suitable calibration factor. The ion implantation process parameters include, for example, energy of implant, beam width, dose, duration, and the like. Typically, the implantation process parameters are selected so as to be substantially similar to those used in device fabrication implantation procedures. However, the process parameters can be tailored to facilitate angular error detection (e.g., by setting a beam width about equal to an aperture of the angle detectors).

With the beta angle maintained constant at about zero, ion implantation is performed at the plurality of alpha offsets and beam current measurements are obtained from the one or more beam incident angle detectors at block 1808. A peak beam current is determined for each ion implantation and alpha offset value resulting in a plurality of measured peak beam current values.

With the alpha angle maintained constant at about zero, ion implantation is performed at the plurality of beta offsets and charge measurements are obtained from the one or more beam incident angle detectors at block 1810. A peak beam current is determined for each ion implantation and beta offset value resulting in a plurality of measured peak beam current values. It is appreciated that the present invention includes performing ion implantations at various alpha and beta offset values simultaneously and is not limited to performing ion implantations for alpha offsets with beta equal to zero and performing ion implantations for beta offsets with alpha equal to zero.

At block 1812, a determination is made as to whether or not a calibration or angular error exists based on the measured beam currents. As discussed previously, the maximum values obtained should be at alpha and beta equal to zero if the ion implantation is devoid of angular errors. Otherwise, angular error or calibration error is present and should be corrected. Next, on angular error existing, an alpha calibration value is chosen as that value of the plurality of alpha offset values that yielded the largest of the values and a beta calibration value is chosen as that value of the plurality of beta offset values that yielded the larges of the beta values at block 1814.

At block 1816, the alpha calibration value and the beta calibration value are applied to the tilt and twist axis, respectively, and a verification process is performed. The verification process can simply be performance of an ion implantation to verify is similar measured beam current values are obtained or, alternately, can employ a number of alpha and beta offset values. If the verification is successful, the method ends and the ion implantation system is considered properly calibrated. Otherwise, the method returns to block 1804 where the where the process disk is once again initialized to alpha and beta values of zero.

It is appreciated that variations of the method 1800 are contemplated and in accordance with the present invention. For example, the process disk can be initialized to other values instead of zero and both the alpha and beta offsets can vary for each implantation instead of holding one constant. Additionally, beam current data obtained by the angle detectors can be stored in a database, along with other information such as the alpha and beta values and ion implantation process parameters so as to be utilized in situ and/or for other calibration procedures. Thus, the measured beam current values can be compared with those in the database to substantiate and correlate the calibration values.

It is further appreciated that the present invention has at least partially been illustrated and described according to alpha, beta, twist, and tilt axes. However, the present invention is not limited to specific axes and can operate with respect to one or more axes aside from twist and tilt axes. Additionally, the present invention has been described and illustrated with a number of beam discriminating structures comprised at least partly of one or more tube portions and/or one or more profile holes. However, it is appreciated that other suitable beam discriminating structures can be employed so long as those structures can selectively discriminate passage of charge and/or charged ions through an aperture having a selected aspect ratio(s).

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. An ion beam incident angle detector for ion implantation systems comprising:

a structure having a hole therethrough defining an aperture, the aperture extending through the structure along an axis and having a selected aspect ratio that selectively prevents ions in the ion beam from passing therethrough according to an angle of incidence between the ion beam and the structure; and a sensor mechanism configured to receive the ions that pass through the aperture in the structure, the sensor providing a signal as a function of an amount of the charged ions that pass through the aperture.

2. The angle detector of claim 1, wherein the sensor mechanism comprises a charge collector.

3. The angle detector of claim 2, wherein the charged ions that pass through the aperture build up charge on the charge collector.

4. The angle detector of claim 1, wherein a portion of the structure having the aperture associated therewith is manufactured in a material selected from the group consisting of aluminum, aluminum coated with silicon, graphite and anodized aluminum.

5. The angle detector of claim 3, wherein the charge collector is operable as a charge monitor.

6. The angle detector of claim 1, wherein the aspect ratio of the aperture yields a suitable signal to noise ratio.

7. The angle detector of claim 1, wherein the structure comprises a tube.

8. The angle detector of claim 1, wherein the structure is substantially grounded such that ions striking an interior surface of the aperture become substantially neutral or the interior surface of the aperture is configured to collect or trap ions that strike the interior surface.

9. The angle detector of claim 1, wherein the sensor mechanism comprises a faraday that measures beam current as a function of the angle of incidence.

10. The angle detector of claim 9, wherein the structure comprises a process disk having the hole therethrough that defines at least a portion of the aperture.

11. The angle detector of claim 1, further comprising a process disk onto which the structure is mounted, wherein the structure comprises a tube generally centered and extending along the axis, and wherein the structure is substantially grounded such that ions striking an interior surface of the aperture become substantially neutral or the interior surface of the aperture is configured to collect or trap ions that strike the interior surface.

12. An end station of an ion implantation system comprising:
   a process chamber configured to accommodate one or more ion beam angle detectors; and
   a process support structure adjustable about one or more axes, and configured to accommodate one or more wafers,
   wherein each of said ion beam angle detectors includes a beam discriminating structure mounted on said process support structure.

13. The end station of claim 12, further comprising a chamber mount that supports the process chamber and supports adjustment of the process support structure about the one or more axes.

14. The end station of claim 12, wherein the process support structure comprises a multi-wafer process disk operable to support a plurality of wafers or a single-wafer platen for implantation thereof.

15. The end station of claim 12, wherein the one or more axes comprise an alpha axis and a beta axis, respectively.

16. The end station of claim 12, wherein the one or more ion beam angle detectors respectively comprise:
   a charge collector;
   an insulative layer formed on charge collector, the insulative layer having an aperture of a first diameter along an axis that exposes a portion of the charge collector; and
   a tube portion as the beam discriminating structure formed on the insulative layer, the tube portion being grounded and having an aperture along the axis, wherein the aperture permits ions traveling substantially in-line with the axis to impact the exposed portion of the charge collector and build up charge thereon and wherein ions traveling substantially off-line with the axis impact the tube portion and lose at least a portion of charge associated therewith.

17. The end station of claim 12, wherein the one or more ion beam angle detectors respectively comprise:
   a charge collector;
   an insulative layer formed on charge collector, the insulative layer having an aperture of a first diameter along an axis that exposes a portion of the charge collector; and
   a tube portion as the beam discriminating structure formed on the insulative layer, the tube portion having an aperture along the axis, wherein the aperture permits ions traveling substantially in-line with the axis to impact the exposed portion of the charge collector and build up charge thereon and wherein ions traveling substantially off-line with the axis impact the tube portion and are collected thereby.

18. The end station of claim 12, the process support structure being calibrated via the one or more ion beam angle detectors about the one or more axes.

19. The end station of claim 12, the process support structure being adjusted in situ via the one or more ion beam angle detectors about the one or more axes.

20. The end station of claim 12, the ion beam angle detectors being located within a scanning range of an ion beam.

21. The end station of claim 12, the ion beam angle detectors being located outside a scanning range of an ion beam.

22. The end station of claim 12, wherein the one or more angle detectors respectively comprise:
   a tube portion as the beam discriminating structure mounted on the process support structure and aligned with a an aperture defined in the process support structure, wherein the tube portion and aperture define a passageway for allowing ions to pass therethough; and
   a sensor mechanism configured to receive the ions that pass through the tube portion and aperture, the sensor mechanism providing a signal as a function of an amount of the ions passing through the tube portion and aperture.

23. The end station of claim 22, wherein the sensor mechanism comprises a faraday located downstream of the process support structure that measures beam current as a function of charged ions that maintain their charge after passing through the aperture defined in the process support structure.

24. The end station of claim 22, wherein the sensor mechanism comprises a charge collector located downstream of the process support structure that collects charge as a function of charged ions that maintain their charge after passing through the aperture defined in the process support structure.

25. The end station of claim 12, wherein the one or more angle detectors respectively comprise:
   an array of tubes as the beam discriminating structure mounted on the process support structure aligned with an array of apertures defined in the process support structure wherein the array of tubes and the array of apertures define an array of passageways for allowing ions to pass therethough; and a sensor mechanism configured to receive the ions that pass through the array of passageways for collectively measuring beam current as a function of charged ions that maintain their charge after passing therethrough.

26. The end station of claim 12, wherein the one or more angle detectors respectively comprise:

an array of tubes as the beam discriminating structure mounted on the process support structure and in-line with an array of holes through the process support structure, wherein apertures are defined by the tube portions and the holes; and a plurality of faradays each associated with one of the array of tubes, that collectively measure beam current as a function of charged ions that maintain their charge after passing through the apertures, wherein each of the plurality of faradays are associated with a portion of the ion beam.

27. The end station of claim 12, wherein the one or more angle detectors respectively comprise:

an array of holes extending through the process support structure as the beam discriminating structure, wherein apertures are defined by profile holes; and a sensor mechanism configured to receive the ions that pass through the profile holes, the sensor providing a signal as a function of an amount of the charged ions that pass through the profile holes.

28. The end station of claim 12, wherein the one or more angle detectors respectively comprise:

an array of holes extending through the process support structure as the beam discriminating structure, wherein apertures are defined by profile holes; and a plurality of sensor mechanisms each associated with one of the profile holes configured to receive the ions that pass through the profile holes, the sensors each providing a signal as a function of an amount of the charged ions that pass through the profile holes, wherein each of the plurality of sensors is associated with a portion of the ion beam.

29. A method of aligning an incident ion beam comprising:

providing a process support structure configured to support one or more wafers and having one or more angle detectors;

aligning the process support structure along one or more axes to initial first and second angle settings;

determining a plurality of first angle offset values and second angle offset values;

performing ion implantations for the plurality of second angle offset values and obtaining a plurality of second angle charge values;

performing ion implantations for the plurality of first angle offset values and obtaining a plurality of first angle charge values; and determining a first angle calibration value according to the plurality of first angle charge values and a second angle calibration value according to the plurality of second angle charge values.

30. The method of claim 29, further comprising applying the first angle calibration value and the second angle calibration value to the process support structure and verifying alignment of the process support structure.

31. The method of claim 30, further comprising the following on a failed verification of the alignment:

determining a plurality of second first angle offset values and second angle offset values;

performing ion implantations for the plurality of second angle offset values and obtaining a plurality of second angle charge values;

performing ion implantations for the plurality of second first angle offset values and obtaining a plurality of second first angle charge values;

determining existence of angular error; and determining a second first angle calibration value according to the plurality of second first angle charge values and a second angle calibration value according to the plurality of second angle charge values;

applying the second first angle calibration value and the second angle calibration value to the process support structure and verifying alignment thereof.

32. The method of claim 31, wherein the method is completed iteratively until the alignment is successfully verified.

33. A method of aligning an incident ion beam comprising:

providing a process support structure configured to support one or more wafers and having one or more angle detectors;

aligning the process support structure to initial first and second angle values;

determining a plurality of first angle offset values and second angle offset values;

performing ion implantations for the plurality of second angle offset values and obtaining a plurality of second angle beam current values;

performing ion implantations for the plurality of first angle offset values and obtaining a plurality of first angle beam current values; and determining an first angle calibration value according to the plurality of first angle beam current values and a second angle calibration value according to the plurality of second angle beam current values.

34. The method of claim 33, further comprising applying the first angle calibration value and the second angle calibration value to the process support structure and verifying alignment of the process support structure.

35. The method of claim 34, further comprising the following on a failed verification of the alignment:

determining a plurality of second first angle offset values and second angle offset values;

performing ion implantations for the plurality of second angle offset values and obtaining a plurality of second angle beam current values;

performing ion implantations for the plurality of second first angle offset values and obtaining a plurality of second first angle beam current values;

determining existence of angular error; and determining a second first angle calibration value according to the plurality of second first angle beam current values and a second angle calibration value according to the plurality of second angle beam current values;

applying the second first angle calibration value and the second angle calibration value to the process support structure and verifying alignment thereof.

36. The method of claim 35, wherein the method is completed iteratively until the alignment is successfully verified.

37. A method of aligning a process support structure and incident ion beam in situ comprising:

selecting ion implantation process parameters, the process parameters including at least an angle of implant;

determining a range of acceptable charge values for one or more angle detectors based at least partly on the process parameters and angle implantation charge data;

initiating an ion implantation process in accordance with the ion implantation process parameters;

monitoring charge values from the one or more angle detectors during the ion implantation process; and appropriately modifying the ion implantation process parameters during the ion implantation process on obtaining charge values outside of the acceptable range of charge values.

38. The method of claim 37, further comprising calibrating the process disk prior to initiating the ion implantation process.

39. The method of claim 37, wherein modifying the process parameters comprises adjusting first and second angle values by determined offset values.

40. A method of aligning an incident ion beam comprising:

providing a process support structure configured to support one or more wafers and having one or more angle detectors;

aligning the process support structure to initial first and second angle values;

determining a plurality of first angle offset values and second angle offset values;

performing ion implantations for the plurality of second angle offset values and obtaining a plurality of second angle signal values;

performing ion implantations for the plurality of first angle offset values and obtaining first angle signal values; and determining an first angle calibration value according to the plurality of first angle signal values and a second angle calibration value according to the plurality of second angle signal values.

41. The method of claim 40, wherein the first angle signal values and the second angle signal values are based on accumulated charges obtained by a charge collector.

42. The method of claim 41, wherein the first angle signal values and the second angle signal values are based on beam current values measured by a faraday.

* * * * *